(12) United States Patent
Eisenhuth et al.

(10) Patent No.: US 8,615,703 B2
(45) Date of Patent: Dec. 24, 2013

(54) ADVANCED BITWISE OPERATIONS AND APPARATUS IN A MULTI-LEVEL SYSTEM WITH NONVOLATILE MEMORY

(75) Inventors: Robert B Eisenhuth, Boulder, CO (US); Stephen P. Van Aken, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 755 days.

(21) Appl. No.: 12/794,706

(22) Filed: Jun. 4, 2010

(65) Prior Publication Data

US 2011/0302475 A1      Dec. 8, 2011

(51) Int. Cl.
*H03M 13/00*     (2006.01)

(52) U.S. Cl.
USPC .......................................................... 714/784

(58) Field of Classification Search
USPC .................... 714/784, 781, 762, 756
See application file for complete search history.

(56) References Cited

U.S. PATENT DOCUMENTS

| | | | | |
|---|---|---|---|---|
| 6,034,976 A * | 3/2000 | Mossberg et al. | ............... | 372/32 |
| 6,034,996 A | 3/2000 | Herzberg | | |
| 6,160,854 A | 12/2000 | Heegard et al. | | |
| 7,028,246 B2 * | 4/2006 | Kim et al. | ..................... | 714/784 |
| 7,142,612 B2 | 11/2006 | Horowitz et al. | | |
| 7,379,505 B2 | 5/2008 | Zaleski, II et al. | | |
| 2003/0235149 A1 | 12/2003 | Chan et al. | | |
| 2004/0001561 A1 | 1/2004 | Dent et al. | | |
| 2004/0014444 A1 | 1/2004 | Ben Rached et al. | | |
| 2007/0171714 A1 | 7/2007 | Wu et al. | | |
| 2007/0171730 A1 | 7/2007 | Ramamoorthy et al. | | |
| 2008/0137414 A1 | 6/2008 | Park et al. | | |
| 2008/0151621 A1 | 6/2008 | Kong et al. | | |
| 2009/0013233 A1 | 1/2009 | Radke | | |
| 2009/0132889 A1 | 5/2009 | Radke | | |
| 2009/0241006 A1 | 9/2009 | Liikanen et al. | | |

OTHER PUBLICATIONS

Ungerboeck, Channel Coding with Multilevel/Phase Signals, Jan. 1982, Ieee Transactions on Information Theory, vol. IT-28, No. 1, pp. 55-67.
PCT search report and written opinion dated Dec. 27, 2011 for International application No. PCT/US2011/037194.
Wicker, Stephen B., *Error Control Systems for Digital Communication and Storage*, 1995, Prentice-Hall pp. 238-239 and 290-332.

* cited by examiner

*Primary Examiner* — Phung M Chung
(74) *Attorney, Agent, or Firm* — Pritzkau Patent Group, LLC

(57) ABSTRACT

A digital system, components and method are configured with nonvolatile memory for storing digital data using codewords. The data is stored in the memory using multiple bits per memory cell of the memory. A code efficiency, for purposes of write operations and read operations relating to the memory, can be changed on a codeword to codeword basis based on input parameters. The code efficiency can change based on changing any one of the input parameters including bit density that is stored by the memory. Storing and reading fractional bit densities can be performed.

24 Claims, 10 Drawing Sheets

ADVANCED BITWISE OPERATIONS AND APPARATUS IN A MULTI-LEVEL SYSTEM WITH NONVOLATILE MEMORY

BACKGROUND

The present application is generally related to multi-level information systems and, more particularly, to an apparatus and method relating to bitwise operations in a multilevel system.

U.S. patent application Ser. No. 12/403,546, filed on Mar. 13, 2009 entitled BITWISE OPERATIONS IN A MULTI-LEVEL SYSTEM and published on Sep. 24, 2009 as U.S. Patent Application Publication no. 2009/0241006 A1 (hereinafter the '546 Application) is commonly owned with the present application and is hereby incorporated by reference in its entirety. Inasmuch as the '546 Application provided what Applicants consider as sweeping advantages over the then-existing state of the art, Applicants consider that the present application provides still further advantages.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In general, a digital system is configured with nonvolatile memory for storing digital data. In one aspect of the present disclosure, an apparatus forming part of the digital system and an associated method are configured for receiving, using a Reed Solomon encoder, an input data stream including input data that is provided through the digital system to produce a Reed Solomon encoded stream that is made up of a series of Reed Solomon symbols. The Reed Solomon encoded stream is received using a packing arrangement for producing a re-blocked output data stream such that at least one portion but not all of the re-blocked output data stream is configured to be subject to a code efficiency based on a convolutional code. The re-blocked output data stream is modified by the packing arrangement to support changes in the code efficiency of the convolutional code which is associated with a predetermined number of Reed Solomon symbols in the input stream based on changing one or more values of one or more input parameters that are provided to the packing arrangement. The re-blocked output data stream is received using a mapping arrangement to apply a TCM (Trellis Coded Modulation) code to produce a TCM encoded output data stream. The portion of the TCM encoded output stream is convolutionally encoded, using a convolutional encoder that forms part of the mapping arrangement, according to the code efficiency of the convolutional code to support the changes in the code efficiency as based on the values of the input parameters to produce a mapped output data stream for direction to the nonvolatile memory for storage therein as stored data. In one feature, the portion of the TCM encoded output data is convolutionally encoded as a least significant bit of each one of a plurality of TCM symbols that make up the TCM encoded output stream through cooperation between the packing arrangement and the mapping arrangement. In another feature, each TCM symbol is made up of a plurality of bits and the portion of the TCM encoded output data is convolutionally encoded as at least a least significant bit but less than all of the bits of each one of a plurality of TCM symbols that make up the TCM encoded output stream through cooperation between the packing arrangement and the mapping arrangement. In still another feature, a memory output stream, based on reading the stored data, is received from the nonvolatile memory using a demapping arrangement data and is convolutionally decoded according to the code efficiency to reproduce the TCM encoded output data stream as a demapped output stream based on corresponding ones of the values of the input parameters as provided to the mapping arrangement. The demapped output stream is received, using an unpacking arrangement, to reproduce therefrom the Reed Solomon encoded stream based on the code efficiency in a way that is responsive to changing the code efficiency of the convolutional code associated with the predetermined number of Reed Solomon symbols based on corresponding ones of the values of the one or more input parameters as provided to the packing arrangement. The Reed Solomon encoded stream is received, using a Reed Solomon decoder, from the unpacking arrangement to decode therefrom a read data stream that includes the input data for use by the digital system as read data.

In another aspect of the present disclosure, an apparatus forming part of the digital system and an associated method are configured for receiving, using a block code encoder, an input data stream including input data that is provided through the digital system to produce a block code encoded stream that is made up of a series of block code symbols. The block code encoded stream is received using a packing arrangement for producing a re-blocked output data stream such that at least one portion but not all of the re-blocked output data stream is configured to be subject to a code efficiency based on a convolutional code. The re-blocked output data stream is modified by the packing arrangement to support changes in the code efficiency of the convolutional code which is associated with a predetermined number of block code symbols in the input stream based on changing one or more values of one or more input parameters that are provided to the packing arrangement. The re-blocked output data stream is received using a mapping arrangement to apply a TCM code to produce a TCM encoded output data stream. The portion of the TCM encoded output stream is convolutionally encoded, using a convolutional encoder that forms part of the mapping arrangement, according to the code efficiency of the convolutional code to support the changes in the code efficiency as based on the values of the input parameters to produce a mapped output data stream for direction to the nonvolatile memory for storage therein as stored data.

In another aspect of the present disclosure, an apparatus forming part of the digital system and an associated method are configured for receiving a Reed Solomon encoded stream, using a packing arrangement, to produce a re-blocked output data stream such that at least one portion of the re-blocked output data stream is configured to be subject to a code efficiency based on a convolutional code. The packing arrangement and associated method are adapted for changes in the code efficiency of the convolutional code which is associated with a predetermined number of Reed Solomon symbols in the input stream based on given values of one or more input parameters that are provided to the packing arrangement as an intermediate step preparatory to storing the input data in the nonvolatile memory.

In still another aspect of the present disclosure, an apparatus forming part of the digital system and an associated method are configured for using a nonvolatile memory including a plurality of memory cells for storing digital data. A packing arrangement, forming part of the apparatus, and an associated method are configured for receiving an input data stream that is provided by the system for producing an output data stream that is based on a block size for storage in the memory cells and are selectively operable in a first mode based on one or more input parameters to produce a first block size for storage in the memory cells and operable at least in a second mode to produce a second block size that is different than the first block size responsive to a change in the input parameters for selectably changing the block size during operation thereof.

In still another aspect of the present disclosure, an apparatus forming part of the digital system and an associated method are configured for using a nonvolatile memory including a plurality of memory cells for storing digital data such that at least some of the memory cells can store more than one bit. An encoder arrangement, forming part of the apparatus, and an associated method are configured to receive an input data stream that is provided by the system for producing an output data stream that is based on a selected number of bits per cell coding for storage in the memory cells and are selectively operable in a first mode based on one or more input parameters to produce a first bit density for storage in the memory cells as the selected number of bits per cell and operable at least in a second mode to produce a second bit density that is different than the first bit density responsive to a change in the input parameters for selectably changing the number of bits per cell coding during operation thereof.

In yet another aspect of the present disclosure, an apparatus forming part of the digital system and an associated method are configured for using a nonvolatile memory including a plurality of memory cells for storing digital data such that at least some of the memory cells can store more than one bit. An encoder arrangement, forming part of the apparatus, and an associated method are configured to receive an input data stream that is provided by the system as a series of input symbols for producing an output data stream that is based on a selected number of bits per cell coding for storage in the memory cells and are reconfigurable based on one or more input parameters for changing at least the selected number of bits per cell coding to be stored in the memory cells of the nonvolatile memory.

In a continuing aspect of the present disclosure, an apparatus forming part of the digital system and an associated method are configured for using a nonvolatile memory including a plurality of memory cells for storing digital data such that at least some of the memory cells can store more than one bit. A decoder arrangement, forming part of the apparatus, and an associated method are configured for receiving a read data stream that is provided responsive to reading a data structure that is stored in the nonvolatile memory to provide a series of read symbols, containing a user data stream originally encoded during a write operation as part of the data structure, and stored in a series of the memory cells for reproducing the user data stream based on a selected one of a number of different bit densities per cell coding as stored in the series of memory cells. The decoder arrangement and associated method are reconfigurable based on one or more input parameters for changing at least the selected one of the bit densities to match the bit densities as stored in the series of memory cells as part of reproducing the user data stream.

In another aspect of the present disclosure, an apparatus forming part of the digital system and an associated method are configured for using a nonvolatile memory including a plurality of memory cells for storing digital data such that at least some of the memory cells can store more than one bit. A demapping arrangement, forming part of the apparatus, and an associated method are configured for receiving a memory output stream based on reading the stored data from the nonvolatile memory where the memory output stream is in the form of a TCM encoded output data stream having one portion but not all of the TCM encoded output data stream being subject to a code efficiency that is established by given values of a set of parameters during an encoding operation and for convolutionally decoding the TCM encoded output data stream based on the code efficiency to reproduce the TCM encoded output data stream as a demapped output stream based on corresponding ones of the given values of the input parameters as provided during the encoding operation which demapped output stream contains a Reed Solomon encoded stream. An unpacking arrangement and the associated method are configured for receiving the demapper output stream and reproducing therefrom the Reed Solomon encoded stream based on the code efficiency and responsive to changing the code efficiency of the convolutional code associated with the predetermined number of Reed Solomon symbols based on corresponding ones of the given values of the one or more input parameters as provided during the encoding operation. A Reed Solomon decoder and the associated method are configured for receiving the Reed Solomon encoded stream from the unpacking arrangement to decode therefrom a read data stream that includes the input data for use by the digital system as read data.

In another aspect of the present disclosure, an apparatus forming part of the digital system and an associated method are configured for using a nonvolatile memory including a plurality of memory cells for storing digital data responsive to a host device. An encoder/decoder arrangement, forming part of the apparatus, and an associated method are configured to interface the host device with the nonvolatile memory for transferring read data and write data therebetween in a series of codewords with each codeword having a codeword size such that an encoded data flow from the host device to the nonvolatile memory and a decoded data flow from the nonvolatile memory to the host device are each subject at least to a code efficiency that is based on a convolutional code and the encoder/decoder arrangement is configured for receiving one or more input parameters such that the code efficiency is changeable responsive to a change in the input parameters on a codeword to codeword basis. In one feature, each codeword is made up of a plurality of symbols to make up a codeword length with each symbol representing a value to be stored in one of the memory cells and the encoder/decoder arrangement, in conjunction with the associated method, is configured for operating in a first mode to produce a first code efficiency in a first codeword of a given series of codewords and for operating in a second mode to produce a second code efficiency in a second codeword of the given series of codewords.

In still another aspect of the disclosure, in a digital system configured with nonvolatile memory for storing digital data, a data structure is stored in the nonvolatile memory. The data structure includes a series of TCM symbols, stored in the nonvolatile memory, each of which represents at least two bits having at least the least significant bit of each TCM symbol subject to a convolutional code and at least one other bit of each symbol is not convolutionally encoded and the TCM symbols make up a series of Reed Solomon symbols forming a series of codewords such that a code efficiency of the convolutional code for at least one codeword in the data structure is different from the code efficiency of an adjacent codeword in the data structure.

In yet another aspect of the present disclosure, a method is described for use with a digital system configured with nonvolatile memory for storing digital data in a data structure in the nonvolatile memory. The method includes writing a series of TCM symbols to the nonvolatile memory, each of which TCM symbols represents at least two bits having at least the least significant bit of each TCM symbol subject to a convolutional code and at least one other bit of each symbol is not convolutionally encoded and the TCM symbols make up a series of Reed Solomon symbols forming a series of codewords such that a code efficiency of the convolutional code for at least one codeword in the data structure is different from the code efficiency of an adjacent codeword in the data structure.

In a continuing aspect of the present disclosure, in a digital system configured with nonvolatile memory for storing digital data, a data structure is stored in the nonvolatile memory. The data structure includes a series of TCM symbols, stored in the nonvolatile memory in a series of memory cells that form part of the nonvolatile memory, with each TCM symbol including at least one bit and making up a data transfer previously written to the nonvolatile memory such that, at least on average, a fractional number of bits per cell is stored by the series of memory cells as representing the data transfer.

In a further aspect of the present disclosure, a method is described for use with a digital system configured with nonvolatile memory for storing digital data. The method includes writing a series of TCM symbols as a data transfer to the nonvolatile memory in a series of memory cells that form part of the nonvolatile memory with each TCM symbol including at least one bit such that, at least on average, a fractional number of bits per cell is stored by the series of memory cells as representing the data transfer. In one feature, the data transfer includes user data and the method further includes reading the series of TCM symbols from the nonvolatile memory based on the fractional number of bits per cell to recover the user data.

In another aspect of the present disclosure, an apparatus forms part of a digital system configured with nonvolatile memory for storing digital data. The apparatus includes a write arrangement for writing, in a data transfer operation, a data structure to the nonvolatile memory as a series of TCM symbols in a series of memory cells that form part of the nonvolatile memory, with each TCM symbol including at least one bit and which data structure includes user data such that, at least on average, a fractional number of bits per cell is stored by the series of memory cells. In one feature, a read arrangement is configured for reading the series of TCM symbols from the nonvolatile memory based on the fractional number of bits per cell to recover the user data.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be illustrative rather than limiting.

DETAILED DESCRIPTION

Figure 1:
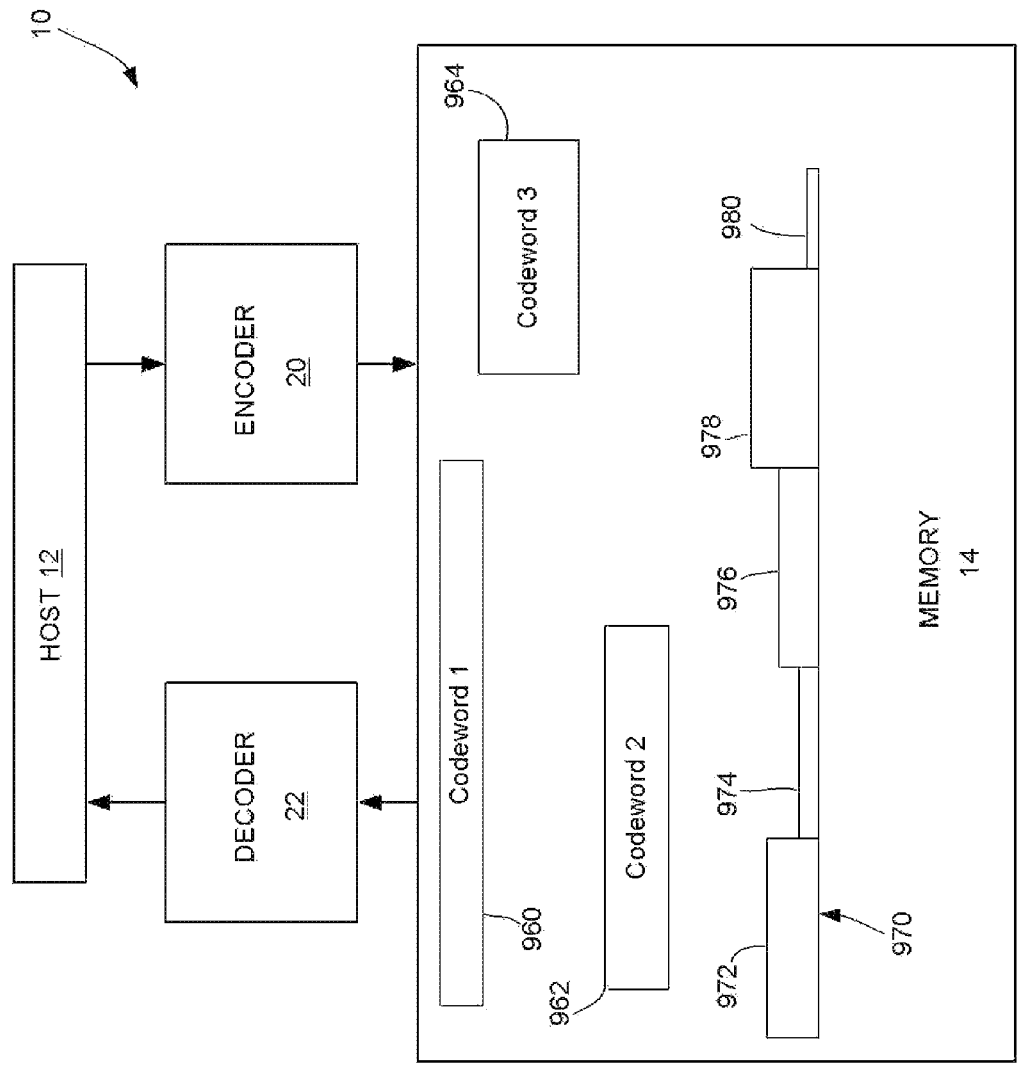
FIG. 1 is a block diagram of a system, produced in accordance with the present disclosure, providing for multi-bit per cell storage in a memory and illustrating certain details with respect to the manner in which data can be stored.

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be adopted for purposes of enhancing the reader's understanding, with respect to the various views provided in the figures, and is in no way intended as being limiting.

The present disclosure provides what are considered by Applicants as remarkable improvements with respect to the performance of data storage and retrieval systems based on non-volatile memory. This disclosure refers to a multi-bit coding system as described, for example, in the above incorporated '546 Application in which two separate groups of bits are being coded with the two separate groups of bits forming different portions of each one of a series of, for example, Trellis Coded Modulation (TCM) symbols. One group of bits which may be referred to as the LSBs of each TCM symbol includes at least the least significant bit and may include additional bits of successively greater significance, but not all of the bits of the TCM symbol. Another group of bits, which may be referred to as the MSBs, includes all of the remaining bits of the TCM symbol other than the LSBs and may include the most significant bit and may include additional bits of successively lesser significance but not all of the bits of the TCM symbol. In one embodiment, there are two MSBs for three bit per cell coding. In another embodiment, there are three MSBs for four bit per cell coding. Other embodiments are readily configurable by one having ordinary skill in the art with this overall disclosure in hand.

Performance benefits according to the present disclosure include increased storage capacity for a given amount of nonvolatile memory as well as enhancements relating to the reliability and longevity of the data storage systems to which the teachings that have been brought to light herein have been applied. Prior art systems that use, by way of example, NAND flash require inclusion of a mechanism to correct errors that naturally occur in the memory devices. The present disclosure provides a powerful error detection and correction mechanism that underlies a performance gain relative to prior art systems that employ nonvolatile memory. Applicants recognize that error rates in such memory devices can be quantified as statistical quantities that are predictable for particular memory devices as a function of device technology, as well as by environmental and usage statistics. Knowledge of these error rates and the manner in which they change over the lifetime of a memory device can be used to construct error detection and correction systems that offer optimal performance for each memory device. Furthermore, Applicants recognize that one may design a generalized error correction system that can be parameterized to operate optimally with each of a range of specific memory devices and to operate with each memory device over the lifetime of that memory device.

The present disclosure utilizes encoding and decoding methods involving a combination of algebraic error correction and Trellis Coded Modulation (TCM) to store and retrieve data with application to non-volatile memory devices. In one embodiment, the described encoding and decoding techniques are utilized by a data storage system having a connection to a host computer, encoding and decoding channels, and information storage media. The storage media is provided in the form of one or more non-volatile memory devices which may conform to any suitable technology that is capable of non-volatile retention of data. Present day data storage systems that may benefit from the advanced technology described herein may use NAND flash as the storage medium, but this advanced technology is equally applicable with respect to devices based on any other suitable form of nonvolatile memory either currently available or yet to be developed. Such other forms of nonvolatile member can realize benefits similar to those seen with NAND Flash.

Non-volatile memory devices usable herein are cell based devices in which each cell is capable of storing a unit of information. This unit may store a single bit or multiple bits. Storage of one bit in a non-volatile memory cell requires a data storage system to reliably resolve between two possible states in the cell. Storage of more bits requires additional states, and the ability to resolve among them. If the amount of data in a cell is resolved in terms of sensed voltages, for example, storage of 2 bits per cell requires resolving among four distinct voltages; storage of three bits requires resolving among eight distinct voltages, and so on. It is submitted that prior art systems have stored greater than two bits in flash memory only when using memories with very high reliability and resolving capability relative to the number of bits being stored. In other words, the prior art has taken the approach of attempting to eliminate any possibility of error such that any need for correction is all but eliminated. Applicants recognize, however, that non-volatile devices such as, for example, NAND flash devices, are imperfect devices. As such, it is difficult when using these devices to consistently resolve multiple voltages per cell to such an extent that the benefits attendant to the present disclosure are significant. It should be appreciated that the ability to resolve among such multiple voltages per cell decreases in proportion to the number of voltages and levels that are being resolved. The present disclosure makes possible the storage of multiple bits per cell in memory devices that would, in prior art systems, be incapable of reliably storing and retrieving the same number of bits per cell. The application of a combination of algebraic encoding and TCM encoding accommodates Applicants recognition that for storage of multiple bits per cell, errors are more likely for bits of lesser significance in a given cell than for bits of higher significance in that same cell. This disclosure presents an exemplary description of a system that stores 4 bits per cell. This description, however, is not intended to be limiting. For example, by varying parameters, the same teachings remain applicable for storing as few as 3 bits per cell, or greater than 4 bits per cell.

Turning now to the figures wherein like reference numbers may refer to like components, attention is immediately directed to FIG. 1 which is a block diagram of a system, generally indicated by the reference number 10 in which the system components provide for multi-bit per cell storage and retrieval of data. In system 10, a host computer 12 stores and retrieves data using the storage cells that make up a nonvolatile memory 14. Reading and writing is enabled by an encoding section 20 and a decoding section 22, respectively, that reliably conveys data from the host to the nonvolatile memory and from the memory to the host. Storage of data by the host into the memory is executed in such a way that bit errors occurring when the host reads the data can be identified and removed from the data by the decoding process before being returned to the host.

Still referring to FIG. 1, nonvolatile memory 14 can be made up of one or more individual memory devices each of which may be accessed by encoding section 20, which may be referred to interchangeably as an encoder, or decoding section 22, which may be referred to interchangeably as a decoder. The device technology for the nonvolatile memory may be any non-volatile medium capable of storing more than one bit per cell. NAND Flash would be typical, but any non-volatile technology would be equally applicable, as discussed above.

Host 12 may be any suitable device that issues read and write commands to the data storage and retrieval system. It is normally a processor, and may be part of a computer system, but may also be part of an embedded system. Encoder 20 operates during the process of data transfer from host 12 to memory 14. The function of the encoder is to perform a transformation on data submitted by the host in such a way that errors may be detected and corrected when the host requests that it be read from memory 14. Decoder 22 operates during the process of data transfer from memory 14 to host 12. The function of the decoder is to perform a transformation on data that is retrieved from the memory in the form that the data is stored by the memory and convert the data to the form in which it was originally submitted to the encoder by the host. The form of the data as stored in memory 14 includes an encoding which enables decoder 22 to detect and correct bit errors in the data that occur because of memory 14 imperfections.

Embodiments that are produced according to the present disclosure can apply to the implementation of the encoder, decoder, and nonvolatile memory, as well as applying to a system environment in which the host directs operation by sending commands that result in a transfer of data for storage into the memory and that result of transfer of data stored in the memory to the host.

Figure 2:
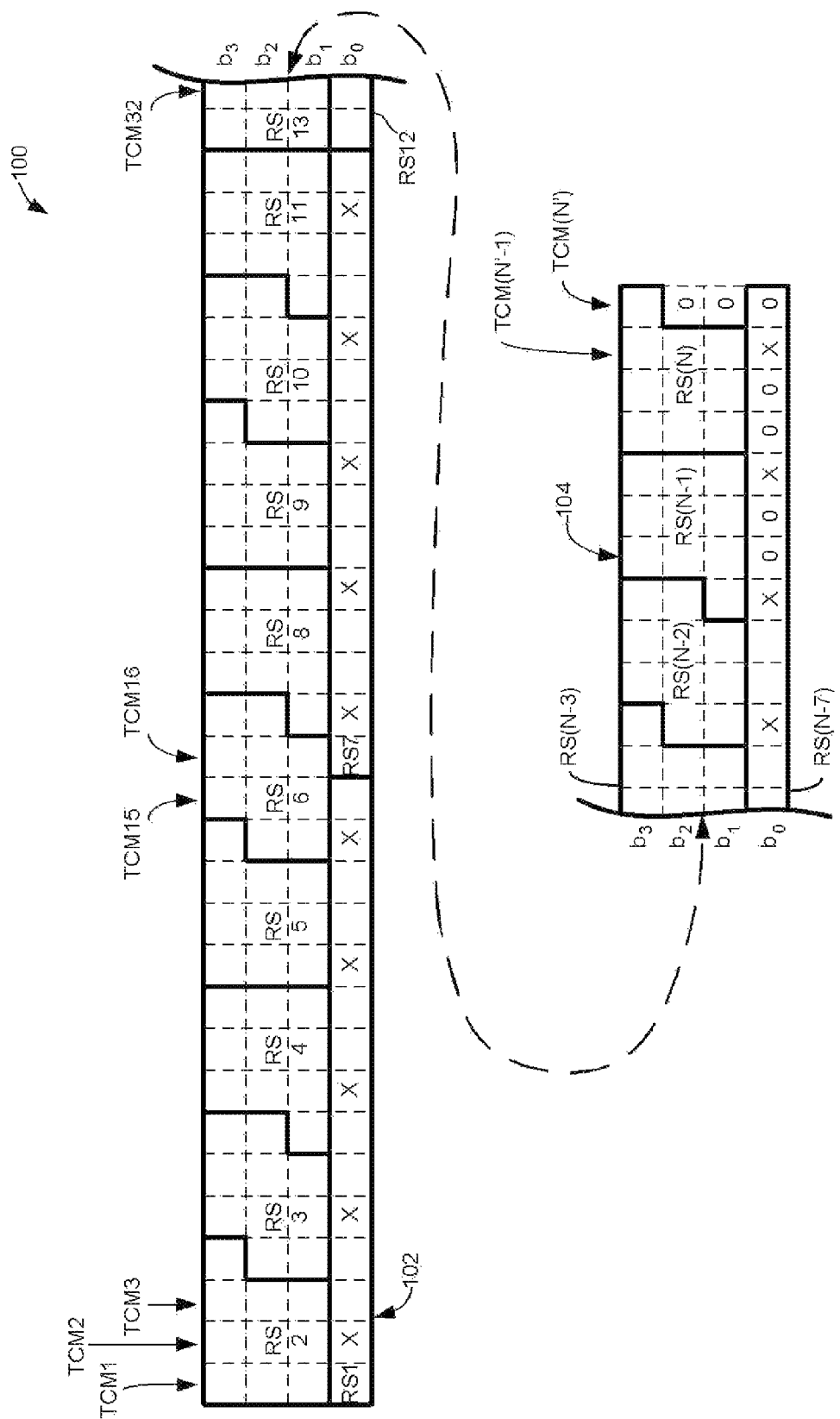
FIG. 2 is a diagrammatic illustration of one embodiment of a data structure that can be stored in the memory of the system of FIG. 1, showing details of the data structure.

Attention is now directed to FIG. 2 which diagrammatically illustrates one embodiment of a data structure that is generally indicated by the reference number 100 and which can be stored in nonvolatile memory 14 (FIG. 1) in accordance with the present disclosure. In particular, FIG. 2 illustrates a plurality of Reed Solomon (RS) symbols designated as RS1-RS13 that are allocated onto a TCM symbol stream for four bit per cell density and for a particular puncture pattern, as yet to be described. It should be appreciated that a Reed Solomon code is one form of a block code. In this regard, any suitable form of block code may be utilized such as, for example, a bitwise BCH code. With this overall disclosure in hand, one of ordinary skill in the art may readily implement other systems, techniques and data structures based on a block code such as a bitwise BCH code. Certain ones of the TCM symbols are individually designated, for example, TCM1, TCM2, TCM3 and TCM15. The significance of the bits for each TCM symbol is designated as $b_0$ to $b_3$ in which $b_0$ is the least significant bit. Reed Solomon symbols RS1, RS7 and RS12 (only partially shown), in an initial portion 102 of the data transfer, are made up exclusively of least significant bit $b_0$ taken from the associated TCM symbols. RS2 to RS6, RS8 to RS11 and RS13 (only partially shown) are made up of the MSB bits $b_1$ to $b_3$. The data structure is illustrated having initial portion 102 and a terminating portion 104. TCM symbols TCM1-TCM32 make up initial portion 102 of the structure including the illustrated portions of RS1-RS13. The terminating portion of the data structure is made up of a group of RS symbols ending with RS(N) and with a TCM symbol TCM(N'), as will be further described. It should be appreciated that the data structure of FIG. 2 corresponds to a particular, but exemplary structure stored in the nonvolatile memory. Although the number of LSBs may be greater than one, as described above, FIG. 2 illustrates an embodiment in which three MSBs ($b_1$ to $b_3$) are paired with one LSB ($b_0$) as taken from each 4 bit TCM symbol. As will be seen, "X" symbols in the LSB positions, as well as the non-"X" symbols in the LSB positions, represent code bits that are generated by convolutional encoding prior to actually storing the data structure in memory. In this regard, the data that is carried in the "X" bit positions may be referred to as extra code bits. It is noted that while the present disclosure and the appended claims may refer to the memory as storing TCM symbols, it should be appreciated that what is actually stored is a level that may be considered as a memory target or target level that represents a TCM symbol.

With continuing reference to FIG. 2, the stream of N RS symbols [RS1, RS2, ..., RS(N−1), RS(N)] is packed onto a stream of 4-bit TCM symbols. The term "packing" refers to a process that regroups bits from one symbol format to another symbol format. In this case "packing", a stream of RS Symbols comprising, for example, 10 bits per symbol onto a stream of 4-bit TCM symbols is a process that extracts one bit from the first RS symbol for the LSB of the first TCM symbol and three bits from the second RS symbol for the MSBs of the first TCM symbol. The second TCM symbol is constructed from an additional bit from the first RS symbol for the LSB of the second TCM symbol and three additional bits from the second RS symbol for the MSBs of the second TCM symbol. In order to receive all 10 bits of the first RS symbol, 15 TCM symbols are created. In the present embodiment, 5 of the LSBs associated with these 15 TCM symbols will be X placeholders for convolutional extra code bits while 10 of the LSBs are actual data bits making up the first RS symbol. Note that RS6 overruns the end of RS1. Once a current RS MSB symbol overruns the end of a complete LSB RS symbol, the next RS symbol is dedicated as an LSB RS symbol. As the first 30 TCM symbols are created in FIG. 2, the RS symbols are completed in the order RS2-RS5, RS1, RS6, RS8-RS11 and RS7 with RS7 and RS11 being completed simultaneously at the creation of TCM 30. Since the creation of the first 30 TCM symbols are representative of a complete packing pattern, additional TCM symbols are constructed in similar fashion, taking bits from subsequent RS symbols as required until all RS symbols have been converted into TCM symbols. The packing process continues for as long as there are source symbols (i.e. RS Symbols). If the last 4-bit TCM symbol requires additional bits to be completed because all bits from the RS Symbol stream have been used up, then additional filler bits are inserted to fill out the last 4-bit symbol. The figure shows the manner in which the N symbols are placed onto the 4-bit stream. Each 4-bit symbol is represented by a vertically-arrayed four-bit slice, as shown. The arrangement order of the bits of each RS symbol onto the TCM symbol stream for encoding purposes can be any convenient order, as long as a decoder can exactly reconstruct the original bit sequence of the symbol during a cooperating decoding function. The TCM output stream is the sequence [TCM1, TCM2, ..., TCM(N'−1), TCM(N')]. Note that an input stream of RS symbols of length N generates a TCM stream of N' symbols. The relationship between N and N' is such that for a given parameter set which may include, by way of nonlimiting example, bit-density, RS data length, RS parity length, a convolutional polynomial to be employed and a puncture polynomial to be employed, a specific value of N produces a specific value of N' such that knowing N enables the determination of N'. Hence, the RS to TCM transformation is exact with respect to the number of output bits versus the number of input bits.

It should be appreciated that the first RS symbol in an input stream may reasonably be allocated to MSBs or to LSBs. The choice between LSBs or MSBs is arbitrary so long as a cooperating decoding function is able to exactly reconstruct the sequence. In the present embodiment, the first RS Symbol in a stream is always allocated to the LSB side of the structure on the basis that LSB symbols are consumed more slowly during the encoding operation than MSB symbols. Subsequent to the initial RS symbol, the sequence of RS symbol usage is determined by the particular embodiment. In the configuration shown in the figure, the first RS symbol (RS1) is chosen as an LSB symbol, and the second RS symbol (RS2) is then an MSB symbol. Subsequent RS symbols are allocated to MSB or LSB based on rate of usage. In FIG. 2, five RS symbols (RS2-RS6) are allocated to MSBs following placement of the first RS symbol (RS1) as LSBs. After the allocation of RS6 to MSB usage, RS7 is allocated as a second LSB symbol. The boundary between the first LSB symbol and the second LSB symbol in the figure is the boundary between TCM symbols TCM15 and TCM16. The allocation sequence proceeds in this manner until a number of symbols equal to an RS data length (where the RS data length is the number of RS symbols that make up the complete input data stream) have been used. As will be seen, a system produced according to the present disclosure is configured to monitor the incoming RS data stream and appropriately allocate the incoming RS symbols between LSBs and MSBs.

It should be noted that, in FIG. 2, each RS symbol that is used to fill the MSBs is made up of 10 squares, with each square representing a bit (separated using dashed lines internal to each RS symbol). These bits correspond to the 10 bits of the RS symbol length in the stated configuration of this symbol. In the LSB positions, however, 15 bit squares are depicted (instead of ten). The expansion is the result of additional or extra code bits that are created by convolutionally encoding the LSB bit stream and have been added to the LSB RS Symbols, in a manner that is yet to be described. In FIG. 2, the bit boxes including an "X" indicate the extra code bits. In the present embodiment, each LSB RS symbol includes five extra code bits. The specific values of the extra code bits is based on the values of non-placeholder bits (i.e., the original bits making up each LSB RS symbol. It is noted that the data structure of FIG. 2 is initially generated prior to convolutional encoding of the LSBs by inserting the X designators as placeholders that are later replaced by the extra code bits. Which bits in each RS LSB symbol are placeholders and how many placeholders are inserted, are functions of system parameters defining the configuration; the most important parameter in this regard is the puncture polynomial, which designates certain bits that are omitted and which additional or extra code bits are included after convolutional encoding, as will be further described. For the moment, however, it is sufficient to understand that the data structure of FIG. 2, in the LSB stream, is required to accommodate more bits than the number of bits contained just by the associated RS symbols that are fed into the LSB stream.

At the end of an incoming stream of RS symbols with an arbitrary length designated as an RS codeword length, it may be necessary to insert additional bits in order to achieve closure of the sequence from a TCM encoding and decoding standpoint when using only the exact number of RS symbols in the submitted RS codeword. There are two aspects to this closure, as will be described immediately hereinafter.

In a first aspect, completing the data structure requires the addition of two bits, $b_1$ and $b_2$, at the end of the TCM symbol stream in TCM symbol TCM(N') to make up for the fact that the final RS symbol [RS(N)] fills in only bit $b_3$ of the last TCM symbol. Another situation might be one where the last RS symbol in the LSB position falls short of the boundary demarked by the last bits of the last MSB RS symbol [RS(N)]. In this case, additional bits can be filled-in in the LSB position beyond the end of the last LSB RS symbol in order to provide LSB bits for the terminating TCM symbol(s).

In a second aspect according to the present embodiment, the LSB stream ends with a set of consecutive zeros, the number of which is equal to or exceeds one less than a constraint length K of the convolutional encoder. In the embodiment of FIG. 2, the constraint length may be given as six because of the five final zeros intermixed with the final placeholders in the last LSB symbol. When these consecutive zeros are provided during encoding, they present a known and non-ambiguous termination sequence when decoded so as to avoid associated errors from appearing during the decoding function. To this end, FIG. 2 shows that the last five data bits of the LSBs ending at TCM(N') are zeros. In this regard, it is assumed that the constraint length K=6, because of the requirement, in the present embodiment, that the last K-1 bits are zero. It should be noted that the five zero bits are consecutive in that that they are consecutive data bits. These consecutive data or code bits, however, can be spaced apart by extra code bits, each of which is designated using an X, since the extra code bits are additional bits established by the convolutional encoding process responsive to the pre-encode data bits.

Figure 3:
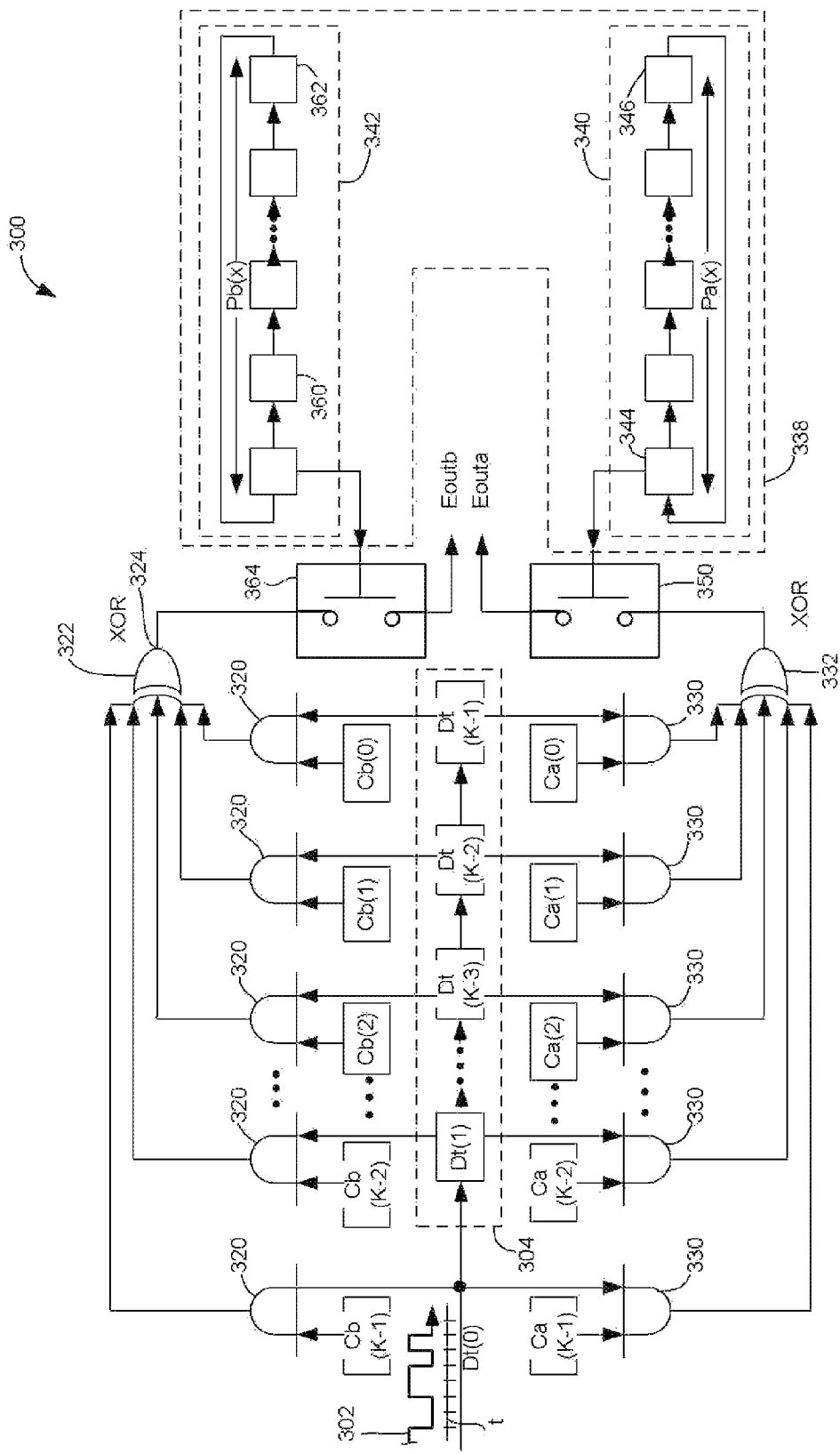
FIG. 3 is a block diagram which illustrates one embodiment of a convolutional encoder that can be used as part of the system of FIG. 1.

FIG. 3 is a block diagram which illustrates one embodiment of a convolutional encoder that is generally indicated by the reference number 300. Through the application of puncturing, the code rate of the output of the encoder can be increased. Generally, a convolutional encoder that uses no puncturing produces two output bits for every input bit; in this case, the code rate is one half because one definition of the code rate is the number of input bits (un-encoded bits) for each output (encoded) bit. It is desirable to reduce the number of output bits generated by an encoder relative to the number of input bits such that the code rate increases. For this purpose, puncturing is applied: all this means is that some of the output bits are removed from the output bit stream of the encoder so that the ratio of input bits to output bits is increased. This increases the efficiency of the encoder, and if it can be accomplished without excessive loss of bit correcting performance, the efficiency gain can be a desirable trade-off.

Encoder 300 of FIG. 3 is one embodiment of a programmable single-bit convolutional encoder. The encoder receives a serial input data stream 302 (indicated by a waveform) as a serial progression of single-bit inputs that are presented according to a series of time increments t. This encoder can be programmed for any convolutional code with a constraint length up to the number of shift register elements plus one. For a given constraint length, the encoder can accommodate any Convolutional Polynomial Coefficients and Puncture Polynomial coefficients.

A shift register 304 (shown within a dashed line) is updated with a current data bit input at the end of a current time increment while shifting data bits previously stored in a well known manner according to time increment t. After the shift register is updated, the next data input in the sequence is presented at the input to the shift register. The shift register is made up of K-1 single-bit wide storage elements, where K is the Constraint Length of the Convolutional Encoder. The current input state is designated as Dt(0) while the shift register elements are designated as Dt(1), ... Dt(K-2), Dt(K-1) to represent the sequential order of receipt. The K-1 register bits along with the current input data bit are used to generate the next output from the encoder.

Stored bits designated as Cb(K-1) through Cb(0), as shown, represent a first one of two convolutional polynomials. The current input data bit, Dt(0), and shift register 304 contents are combined, as shown, to produce one of two output values for each input bit. It should be appreciated that FIG. 3 generalizes the use of the convolutional polynomial in such a way that any bit combination representing the Coefficients Cb(K-1) through Cb(0) may be programmed as the first convolutional polynomial. Each bit of the first convolutional polynomial is provided to a corresponding AND gate 320 such that a value of 1 provided to a given one of the AND gates causes that AND gate to pass an associated input data bit which can be the current bit, Dt(0), or each delayed bit, Dt(1) through Dt(K-1), to an Exclusive Or (XOR) 322. An output 324 of XOR 322 corresponds to a first one of the two output values. Conversely, if the given one of the AND gates receives a zero bit as part of the convolutional polynomial, the corresponding input data bit (current or delayed) will not contribute to the determination of an output bit by XOR 322. In one embodiment, Cb(K-1) through Cb(0) can be stored in a register. These register values can be written as part of an overall configuration before operating the convolutional encoder. XOR 322 combines the outputs from logical AND functions 320. Again, the value produced by logical XOR function 322 is one of the two encoded bits produced for each Dt(0) by the convolutional encoder. Whether this result bit is inserted into the output data stream (Eoutb) depends on whether the bit is enabled or inhibited by a puncturing function that is yet to be described.

Similarly, stored bits labeled Ca(K-1) through Ca(0), as shown, represent the second convolutional polynomial. As is the case with the first convolutional polynomial, any bit combination representing the Coefficients Cb(K−1) through Cb(0) may be programmed as the second convolutional polynomial. Each bit of the second convolutional polynomial is provided to a corresponding AND gate 330 such that a value of 1 provided to a given one of the AND gates causes that AND gate to pass an associated input data bit which can be the current bit, Dt(0), or each delayed bit, Dt(1) through Dt(K−1), to an XOR 332. An output 334 of XOR 332 corresponds to a second one of the two output values. Conversely, if the given one of AND gates 330 receives a zero bit as part of the convolutional polynomial, the corresponding input data bit (current or delayed) will not contribute to the determination of an output bit by XOR 332. In one embodiment, Ca(K−1) through Ca(0) can be stored in a register. These register values can be written as part of an overall configuration before operating the convolutional encoder. Current input data bit Dt(0) and shift register 304 contents are combined with these values, as shown, to produce the second output value using AND gates 330 and XOR 332 for each input bit Dt(0). XOR 332 combines the outputs from logical AND functions 330. Again, the value produced by logical XOR function 332 is the second one of the two encoded bits produced for each Dt(0) by the convolutional encoder. Whether this result bit is inserted into the output data stream (Eouta) depends on the puncturing function that is yet to be described.

In the present embodiment, the puncturing function is performed by a puncture pattern counter section 338 (shown within a dashed line) using a first puncturing shift register 340 (shown within a dashed rectangle) and a second puncturing shift register 342 (shown within a dashed rectangle). First puncturing shift register 340 contains the coefficients of a first puncture polynomial designated as Pa(x). The representation of Pa(x) as a function of "x" illustrates the fact that values comprising Pa(x) are ordered relative to the data stream. Each coefficient value is made up of a single bit and the number of bits making up Pa(x) is equal to constraint length K. It is recognized that equivalence of constraint length and puncture pattern length is exemplary to FIG. 3; embodiments may choose puncture patterns of greater or less length. Regardless of length, cyclic application of the puncture patterns is as described. In the programmable embodiment shown in the figure, the number of bits used for shift register 340 is the same as the value of K, and is therefore determined by the configuration of the convolutional encoder. Shift register 340 is updated for each time increment t of serial input data stream 302. Before the first serial data input is received, shift register 340 is initialized with the value of Pa(x) in such a way that a left-most shift register location 344 is loaded with the most significant bit in Pa(x) and a right-most shift register location 346 is loaded with the least significant bit in Pa(x). After the input data stream begins, puncture shift register 340 is incremented after each time increment: there is a bit-wise left to right movement of the contents of the shift register, and at the same time, the contents of the least significant shift register bit is transferred to the most significant bit of the shift register (this is an end-around shift of the least significant shift register bit). In this way, the value of Pa(x) is used one bit at a time in control of a first output switch function 350. The value of Pa(x) continues to cycle for as long as data is received by the convolutional encoder. The most significant bit in shift register 340 is always used as a control for puncturing as provided to output switch 350. If the most significant shift register bit is a logical "1", then the output of XOR function 332 is inserted into output stream Eouta. If, on the other hand, most significant shift register bit 344 is a logical "0" then XOR output 332 is inhibited (punctured) from entering output stream Eouta.

The puncturing function is further performed using second puncturing shift register 342 in a manner that reflects the operations relating to first puncturing shift register 340. The descriptions of these operations, therefore, may not be repeated in their entirety for purposes of brevity. Second puncturing shift register 342 contains the coefficients of a second puncture polynomial designated as Pb(x). As is the case with Pa(x), the representation of Pb(x) as a function of "x" illustrates the fact that values comprising Pb(x) are ordered relative to the data stream. Each coefficient value is made up of a single bit and the number of bits making up Pb(x) is equal to constraint length K. Further, before the first serial data input is received, shift register 342 is initialized with the value of Pb(x) in such a way that a left-most shift register location 360 is loaded with the most significant bit in Pb(x) and a right-most shift register location 362 is loaded with the least significant bit in Pb(x). After the input data stream begins, puncture shift register 342 is incremented after each time increment. Shifting takes place in essentially the same manner as described with respect to first puncturing shift register 340 such that the value of Pb(x) is used one bit at a time in control of a second output switch function 364. The most significant bit in shift register 342 is always used as a control for puncturing as provided to second output switch 364. If the most significant shift register bit is a logical "1", then the output of XOR function 322 is inserted into output stream Eoutb. If, on the other hand, most significant shift register bit 344 is a logical "0" then XOR output 332 is inhibited (punctured) from entering output stream Eoutb. It should be appreciated that first and second output switches 350 and 364 are diagrammatic representations of switching functions that can be implemented in any suitable manner such as, for example, in software, hardware or any suitable combination thereof by one having ordinary skill in the art with this overall disclosure in hand.

It should be noted that the described puncturing process relating to FIG. 3 can result in a variability in the number of outputs generated at each time increment. For example, if the most significant bits in register locations 344 and 360 are both logical "1" then two bits will be added for the current time increment. If, however, one of these bits is logical "1" and one is a logical "0", then only one bit will be added for the current time increment; and if both bits are a logical "0" then no output bits will be added for the current time increment. The action of puncturing constrains the size of the output stream relative to the input stream such that the largest possible expansion for the encoder is 2:1 for the unpunctured case in which all bits of Pa(x) and Pb(x) are "1"). The output stream size decreases with increasing numbers of "0" values in Pa(x) and Pb(x). Generally, implementations of the convolutional encoder utilize some expansion of the output stream relative to the input stream in order for a desired error correction behavior to occur during decoding. One useful expansion ratio is 3:2, and this is the case illustrated in FIG. 2 where each RS LSB symbol contains 15 bits instead of 10. The added "X"s in the LSB symbols in FIG. 2 illustrate this expansion in the TCM symbols.

Figure 4:
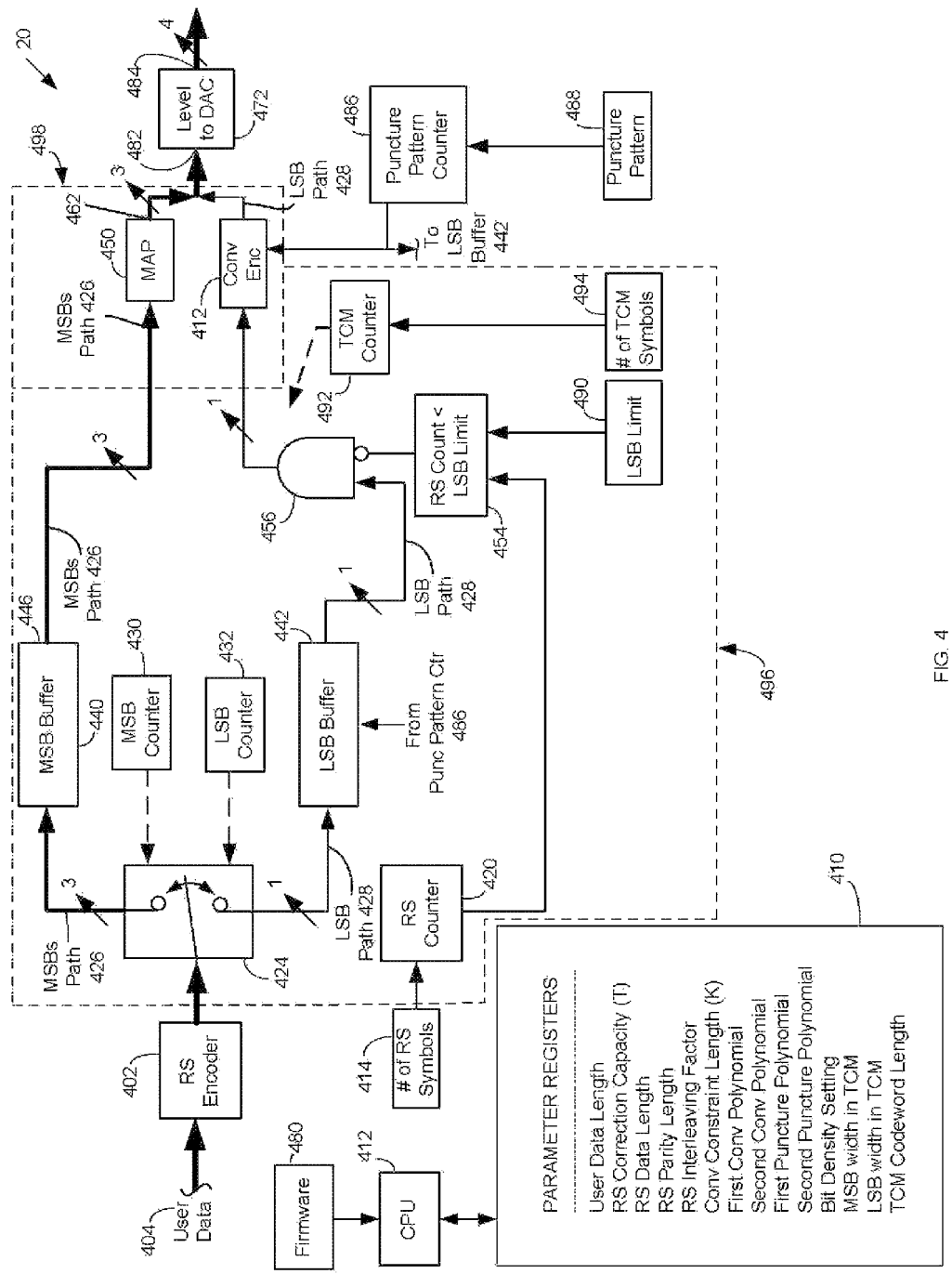
FIG. 4 is a block diagram illustrating details with respect to the encoding section of the system of FIG. 1.

FIG. 4 is a block diagram which illustrates one embodiment of encoder section 20 of FIG. 1. It is noted that lines that support data flow between component blocks have line thicknesses that vary in proportion to the number of bits transported by each line along with numerical designators within the constraints of the figure. It should be appreciated that encoder section 20 implements the stored data structure of FIG. 2. In this regard, FIG. 4 is consistent with FIG. 2 by implementing four bits per cell storage in nonvolatile memory 14, by way of nonlimiting example. For purposes of creating the data structure of FIG. 2, as will be seen, encoder 20 produces pre-encode TCM symbols from an input stream of RS symbols. Generally, in the 4-bit per cell configuration, each pre-encode TCM symbol is made up of four bits. These bits, in turn, are comprised of one LSB and three MSBs. In some cases, the LSB may be a placeholder, X, that is inserted preparatory to later convolutional encoding such that the placeholder is later filled by an extra code bit. It is noted that the convolutional encoding process replaces both placeholders and pre-encode data bits with extra code bits and code bits, respectively. As noted, the pre-encode TCM symbols are later encoded by a mapping function for MSBs and convolutional encoding for the LSB. In each pre-encode TCM symbol, the three MSB bits are encoded by a mapping function that transforms the three-bit field to its encoded form. The LSB bit is added to a convolutional encoder input stream and replaced by the next bit from the convolutional encoder's output. During the LSB bit creation function, placeholder fields, X, are inserted according to the puncture pattern selected for the configuration. These placeholder fields are later replaced by bits from the convolutional encoder during the convolutional encoding process which is applied to the pre-encode LSBs.

In view of the need for cooperation between an encoder section and a decoder section, it should be appreciated that a given decoder implementation may impose limits on the ranges of some controlling parameters such that the given decoder is capable of supporting some encoding configurations (for example, the number of bits per cell), but not others. In some embodiments, a particular decoder may be designed to target specific configurations and to disregard others. For example, a decoder may support three bit per cell and four bit per cell density settings, but not five or more bit per cell density settings. Functionality that differs in this way from one decoder design to another represent embodiments which are all considered to fall within the scope of the present disclosure since each embodiment nevertheless includes a common approach to error correction.

Referring to FIG. 1 and prior to continuing the detailed description of FIG. 4, it is noted that information moving from one system sub-block to another is generally organized as streams of symbols. In the progression from host 12 to NV memory 14 and in the reverse direction from NV memory 14 to host 12, data passes through various representations from user data form through Reed Solomon symbols, then intermediate symbols that culminate in NV memory cell targets during the encoder function, and from NV memory cell targets back to user data form during the decoder function. In both the encoder and decoder functions, data at each step passes from its generation to its consumption as an ordered stream of symbols, with each stream comprising a specific number of symbols.

Attention is again directed to encoder 20 of FIG. 4. A Reed Solomon (RS) encoder 402 receives user data 404 that is provided to the encoder by host 12 (see FIG. 1). Normally, user data 404 can be a specific quantity of 8-bit units (bytes) having an ordered relationship to one another. The user data may be organized according to other bit quantities while readily remaining within the purview of the teachings that have been brought to light herein. Accordingly, the user data may be discussed hereinafter as consisting of bytes while recognizing that the use of any other suitable units would have no substantive influence on implementation by one having ordinary skill in the art. The quantity of user data units for any encoding operation is a parameter used by the encoder and is applied to the operation of RS encoder 402. In one embodiment, the quantity of user data units (user data length) is programmed into a register as depicted by a parameter registers section 410. If RS symbol units have a different number of bytes than user data in the form of bytes, the user data bytes are converted to a set of RS symbols before the RS encoder may operate on them. The exemplary form of RS unit (symbol) presented in this disclosure is 10 bits, though other RS unit sizes are possible and remain within the scope of the teachings herein. User data to RS symbol conversion, in the present example, is a simple conversion of bytes to 10-bit symbols; in effect, the post-conversion result yields four RS symbols (4×10 bits) for every five user data bytes (5×8 bits). Since any given number of user data bytes must be convertible to an integer number of RS symbols, some "don't care" bits may be inserted into the final symbol of the RS result. The number of RS symbols (termed the "RS data length") resulting from user data to RS conversion is an additional parameter programmed into parameter register section 410 by a microprocessor or CPU 412. As shown, runtime RS data length 414 is a runtime input to the encoder. In particular, RS data length 414 is provided to an RS counter 420. Normally, the value of runtime RS data length 414 is sourced from the value of RS data length stored in parameter registers section 410. The connection between the runtime RS data length and the RS data length stored in parameter registers section 410 may be direct or indirect (modified), which ever is most appropriate in a particular embodiment, as will be further described.

It should be noted that RS Encoder 402 and Convolutional Encoder 300 both expand the size of data they encode as a necessary part of the encoding functions they perform. This expansion is incurred by the addition of redundant information that will subsequently be used by the decoding process to remove errors that might have been incurred. Encoding by RS encoder 402 adds RS parity symbols, while encoding by convolutional encoder 300 adds additional bits to the encoded bit stream. Code efficiency as used in this disclosure is a measure of this redundancy against the amount of user data being stored and retrieved. Code efficiency may be interpreted as a relative value that is generally better for lower amounts of redundancy and worse for higher amounts of redundancy. One empirical measure of code efficiency may be taken as a ratio of the total number of bits in a unit of user data to the total number of bits produced by the encoder of FIG. 4 in the encoding that unit of user data. As a simple example, consider a user data unit of 512 bytes (4096 bits) encoded by an encoding function that expands the 4096 input bits by 600 bits. The 600 bits is redundancy added to the 4096 information bits. The code efficiency is then 4096/(4096+ 600), or 87.2%. Various empirical measures are used by those having ordinary skill in the practical arts to measure code efficiency. One of these that has been previously discussed in this disclosure is code rate.

It should be further appreciated that in at least some embodiments, code efficiency can be varied. The effect of better code efficiency, as compared to a relatively lower code efficiency, is generally the difference between lower error correction capacity and higher error correction capacity, respectively. Coding configurations are defined by a set of programmable parameters as will be subsequently described, and values of these programmable parameters can be adjusted so as to yield differing code efficiencies. The values in parameter registers 410 are all determinants to a greater or less extent of code efficiency, hence code efficiency is a configuration attribute that may be adjusted, if necessary, on a codeword to codeword basis.

RS data length is the number of RS symbols constructed from a set of user data symbols (usually bytes) that is User data length units long. FIG. 4 User data symbols may each be taken to be 8 bits wide, and each RS symbol may be taken to be 10 bits wide. Therefore the conversion of User data length 8-bit symbols to RS data length RS symbols each 10-bits wide is the multiplication of User data length by 8/10. If a fractional RS unit (i.e., less than 10 bits) remains after performing this multiplication, the fractional part is rounded out to 10 bits by adding whatever number of bits is necessary to bring the last symbol length to 10 bits. Hence, RS Data length may, in some embodiments be derived directly from the User Data Length. In other embodiments, the RS Data Length may be implemented as an independent register value. Either form of embodiment can be appropriate.

RS encoder 20 uses RS symbols resulting from user data 404 and calculates an additional set of symbols called parity symbols. The parity symbols are an additional ordered set of RS symbols of length "RS parity length" which are appended to the RS symbols obtained from the user data conversion. The value of the RS parity length is normally available from parameter registers section 410. The resulting combination of the user data symbols and the parity symbols is termed as an RS codeword. The length of the RS codeword is a system parameter which may be available in parameter registers section 410 but may also be available as a simple sum of the values RS data length and RS parity length which are also available in parameter registers section 410. The term "RS codeword" has a specific meaning when used in the context of Reed Solomon encoding and decoding; it is also well understood by practitioners of the related disciplines and so details on the theory of Reed-Solomon coding will not be generally repeated for purposes of brevity [See, for example, Wicker, Stephen B., *Error Control Systems for Digital Communication and Storage,* 1995, Prentice-Hall pp. 238-239]. The codeword length is used by the encoder to complete the encoding operation. It is noted that the RS parity length is proportional to the amount of redundancy added by the RS encoder and is determined from a parameter called "T" which is a targeted symbol correction capacity. Generally, for a given RS codeword with a given symbol correction capacity, the system is able to correct up to a certain number of RS symbols in that RS codeword. Increasing the value of T results in the capability to correct additional RS symbols in the codeword. The RS codeword is the output from RS encoder 402. The parameters of RS data length, RS parity length, and RS codeword length are used by components that subsequently receive the RS encoder result.

Referring to FIG. 2 in conjunction with FIG. 4, a multiplexer 424 directs RS symbols emerging from RS Encoder 402 to one of two paths: an MSB path 426, or an LSB path 428. Having completed the process of RS encoding, encoder 20 is configured to then format the data stream for TCM and convolutional encoding. For different encoding embodiments, the arrangement of the RS symbol input stream relative to the TCM requirements results in RS symbol allocation to the LSB section and the MSB section in different proportions, as seen in data structure 100 of FIG. 2. That is, a far greater number of RS symbols is allocated to the MSB path as compared to the number that is allocated to the LSB path. In the embodiment of FIG. 2, RS Symbols are allocated to TCM encoding for 10-bit RS Symbols in a four-bit-per-cell case. Two counters, an MSB counter 430 and an LSB Counter 432 determine the destination for each incoming RS symbol as between MSB path 426 and LSB path 428. In general, the states of the MSB counter and the LSB counter determine whether another RS Symbol is required, and if so the destination (MSB side or LSB side) to which the symbol is directed. If states of both MSB and LSB counters indicate that another RS Symbol is required, an RS Symbol is taken for the LSB side first, and an RS Symbol for the MSB side is taken second. More particularly, whether a particular RS symbol becomes part of the MSB encoding or the LSB encoding is determined by an MSB/LSB sequence pattern that can be derived from (i) a set of encoding parameters including, for example, RS symbol width, (ii) aspects of the TCM convolutional encoding, (iii) the puncture polynomials and (iv) bit density, to be further described. Based on the sequence pattern, the MSB and LSB counters are used as each RS Symbol value becomes available to supply either an MSB Buffer 440 or an LSB Buffer 442.

MSB counter 430 tracks the number of bits in MSB buffer 440. The MSB counter is initialized to zero before the first RS symbol is taken from RS encoder 402. The MSB counter, in the present embodiment, increments by 10 for the first RS symbol and for each additional RS symbol taken into the MSB Buffer. The MSB counter decrements by three for each 3-bit field that is transferred out of the buffer to continue along MSB path 426. When the MSB buffer is at a count that is less than three, or logic detects that it will decrement to zero on the next use cycle, the next RS symbol is taken from the input stream for allocation to the MSB path and the counter value is incremented by 10.

LSB counter 432 tracks the number of bits in LSB buffer 442. The LSB counter is initialized to zero before the first RS symbol is taken from RS encoder 402 and increments by 10 for each additional RS symbol taken into the LSB buffer. The LSB counter decrements by 1 for each bit that is transferred out of the buffer to continue on LSB path 428. When the LSB counter decrements to zero, or logic detects that it will decrement to zero on the next use cycle, the next RS symbol is taken from the input stream for allocation to the LSB path and the counter value is incremented by 10. In situations when both MSB counter 430 and LSB counter 432 enter states that simultaneously request another RS symbol, the next RS symbol is taken by priority into the LSB buffer with a subsequent RS symbol allocated to the MSB buffer.

MSB buffer 440 receives RS symbols directed to this section from multiplexer 424. The symbols are written to this buffer for subsequent usage in MSB encoding path 426. In the exemplary embodiment of a four-bit per cell configuration, as depicted, bits in MSB buffer 440 are consumed 3-bits at a time, i.e. on each use cycle an additional pre-encode TCM symbol is created that takes 3 bits from the MSB buffer that are used as the 3 MSBs of the next TCM Symbol while one LSB bit is taken from the LSB buffer. In the event that a placeholder is to be inserted, however, a bit is not taken from the LSB buffer. Again, this embodiment is exemplary since other configurations can be applied to the same encoder by altering controlling parameters. By way of example, a 3 bit per TCM symbol embodiment can be programmed in which MSB buffer consumption is at the rate of two bits per TCM Symbol instead of three.

An output 446 from the MSB buffer is a three bit value for every TCM symbol. MSB groups of three bits are exemplary to this figure. Some embodiments may employ this value, as well as other values. For example, a 3 bit per cell bit density setting may have a 3 bit TCM symbol in which there is one LSB bit and 2 MSB bits per TCM symbol. Other TCM symbol formats with variations in both MSB width and LSB width are recognized. MSB buffer output 446 is part of the data path that enters the encoding logic which is yet to be described. The MSB bits are inputs to an MSB mapping function 450, yet to be described.

LSB buffer 442 receives RS symbols from multiplexer 424 and are written to the LSB buffer for subsequent usage in LSB encoding path 428. In the depicted four-bit per cell embodiment, bits in the LSB buffer are consumed at the rate of less than one bit per TCM symbol as a result of convolutional encoding that is to be applied. Since convolutional encoding has not been applied as the TCM symbols are being generated using MSB path 426 and LSB path 428, the TCM symbols at this stage may be referred to as pre-encode symbols. Creation of some pre-encode TCM Symbols requires extraction of a bit from the LSB Buffer, and some of the pre-encode TCM Symbols require no additional LSB buffer bit since a placeholder bit is being inserted at this juncture rather than a bit that is based on the user data. The reader will recall that these placeholder bits can be represented by the symbol X in the LSB RS symbols of FIG. 2 and that these placeholder bits are later replaced by extra code bits, produced by convolutional encoding, as part of data structure 100. As will be described in detail below, puncture polynomial patterns control selection between an LSB Buffer bit or a placeholder bit in a sequence of TCM Symbols.

As discussed above, an LSB symbol bit is taken from the LSB Buffer one or zero bits per cycle and asserted to LSB path 428. For purposes of the present discussion, the term "block" corresponds to the value 'Number of TCM Symbols' stored at 414. As an end of block assurance that a constraint length of zeros are the final LSBs of a block, a limit comparator 454 and limit logic 456 force these bit values to zeros during the final K bits of the block, where K is the constraint length of the convolutional code to be applied, as discussed above with regard to FIG. 2. In particular, the LSB bits for TCM symbols TCM(N'), TCM(N'-2), TCM(N'-3), TCM(N'-4) and TCM(N'-6) are forced to zero in FIG. 2.

MSB mapping function 450 receives the MSBs on MSB path 426 and can convert MSB bit patterns from an unencoded representation, as received, to a representation that is intended to reduce the number of bit failures that may occur in the event of errors taking place on read-back. In one embodiment, the mapping is a conversion from a Gray code representation to a binary representation. It is noted that treating the incoming data as Gray coded is optional. Further, it should be appreciated that any suitable, reversible mapping function can be employed and the use of Gray coding is described by way of non-limiting example. Mapping function 450 receives MSBs in groups (groups of three in the present embodiment) and generates an output 462 for each group that is made up of the same number of bits. Output 462 is concatenated with a corresponding LSB generated by aforedescribed convolutional encoder 300 and forwarded to a level to digital to analog converter (DAC) 472. The LSB can be a bit that is responsive to the user data or a code bit in an X position as shown in the RS LSBs of FIG. 2 and described above.

Referring to FIG. 3 in conjunction with FIG. 4, convolutional encoder 300 can receive a current LSB bit from LSB buffer 442 by way of limit logic 456. The convolutional encoder acts on the LSBs as they are received, one bit at a time. Encoding is subject to various parameters that are inputs to convolutional encoder 300. These parameters include convolutional polynomials where the constraint length may itself be a parameter, and puncture polynomials. In a system with a single LSB, per the present embodiment, there are normally two convolutional polynomials (see Ca(0)-Ca(K−1) and Cb(0)-Cb(K−1) in FIG. 2) and two puncture polynomials (stored, for example, as Pa(x) and Pb(x) in FIG. 2). Values of each of these polynomials may vary with a given embodiment. In a system that incorporates more than one LSB, there are additional convolutional and puncture polynomials required as parameters. In some embodiments, these parameters may be programmed into registers associated with the convolutional encoder by system microprocessor 412 as directed by firmware 480 that is executed by the microprocessor.

Referring to FIG. 4, an input 482 of level to DAC converter 472 receives the MSB group and an associated LSB for each TCM symbol. The encoded LSB and MSB streams are available from convolutional encoder 300 and MSB mapper 450, respectively. These two resultant data streams are merged with the effect that the stream of TCM symbols is now complete at input 482 of converter 472. The data path widths in this figure are exemplary with respect to the fact that 3 bits for the MSBs and 1 bit for the LSB is shown; other configurations are possible with respect to both MSBs and LSBs. Greater or fewer than 3 MSBs may be included with each TCM Symbol, and greater than 1 LSB bit per TCM symbol may be included. An output 484 of the level to DAC is directed to NV memory 14 of FIG. 1. Level to DAC 472 may perform a final adjustment to each TCM Symbol according to parameters that have to do with requirements relating to the analog value of the data bits that will be written into each NV memory cell. For example, the adjustment may involve the application of an offset value to the TCM Symbol and/or the adjustment may also be a scaling transformation that either compresses or expands the TCM Symbol value relative to a cell target range. Level to DAC 472 can be controlled by parameters in parameter registers 410 that are programmed by microprocessor 412 in cooperation with system firmware 480.

Attention is now directed to additional details with respect to RS counter 420. This counter can be initialized with runtime number of RS symbols 414 that is to be presented from RS encoder 402. The value stored as the runtime number of RS symbols can be up to an entire codeword or longer, where the codeword is an RS codeword or some integral number of RS codewords. If interleaving is employed, the number can be an integral number of codewords implied by the interleaving factor stored in parameter register section 410. RS symbol counter 420 decrements by one for each RS Symbol received by multiplexer 424. The end of the RS block, where the term "RS block" corresponds to the value of the runtime number of RS symbols, for purposes of the present discussion, is indicated when the RS counter decrements to zero to signal the end of the current transfer. In particular, LSB limit 490 is a constant, and is compared with the value in RS counter 420. The RS counter initially starts out as a value greater than LSB limit 490. Since the RS counter decrements with each RS symbol that is transferred, the value stored by the RS counter eventually decrements to the point where it becomes equal to the LSB limit count, as determined by RS/LSB limit comparator 454. Zeros are inserted/stuffed at the point when the RS count becomes less than the LSB limit. As described above, the zeroes are stuffed as LSBs of the pre-encode TCM symbol stream to form part of data structure 100 (FIG. 2) for purposes of indicating the end of the data structure in memory.

As described above, runtime RS length input 414 may be provided from parameter registers 410. The value of the runtime RS length input can be used to initialize RS symbol counter 420 prior to sequencing through a user data input sequence. The value denotes the number of RS symbols that RS encoder 402 will produce by RS encoding the user data stream.

Puncture pattern counter 486 is initialized with a value from a runtime puncture pattern input 488 prior to a user data stream entering encoder 20 and implements puncture pattern counter section 338 of FIG. 3. Pattern input 488 may store first and second puncture polynomials obtained from parameter registers section 410. Puncture pattern counter 486 controls placeholder bit generation (the X positions in the RS LSB symbols of FIG. 2) in the generation of the LSB stream making up pre-encode TCM symbols. The puncture pattern is a bit pattern with a length that, in FIG. 2, is the same as the constraint length of convolutional encoder 300, however, other embodiments may use a puncture bit pattern length larger or smaller than the constraint length. Puncture pattern counter 486 is preset with puncture pattern values prior to handling a stream of user data symbols. As described above with regard to puncture pattern counter section 338 of FIG. 3, puncture pattern counter 486 rotates the value of the puncture patterns by one bit position for each TCM symbol that is created so that the same puncture pattern counter bit position (i.e., the leftmost bits for Pa(x) and Pb(x) in FIG. 3) is always applied to the current encoding. Since the convolutional encoder, in the absence of puncturing, generates two output bits for each input bit, the addition of puncture patterns reduces this ratio to something less than two to one. The puncture pattern counter controls whether the LSB of each pre-encode TCM symbol is an expansion bit (placeholder X) or a bit from the input LSB stream. The puncture pattern counter provides an output to convolutional encoder 300 as well as to LSB Buffer 486 such that the puncture pattern counter and the LSB Buffer cooperate for purposes of generating placeholders in the LSB path at the output of the LSB Buffer.

RS/LSB limit comparator 454 comes into play at the end of an RS block of TCM encoding where it is necessary to assert the final K–1 LSB bits of the pre-encoded TCM Symbol stream to zeros (where K is the constraint length of the convolutional encoder), as seen by way of example in FIG. 2 and described above. The LSB limit count is obtained as an LSB limit value 490 and is compared with the count of RS symbol counter 420 on a time increment by time increment basis to provide an indication of when to force the pre-encode LSB stream to zeros. This allows convolutional encoder 300 to encode a known closing sequence into the encoded TCM symbol sequence with the result that upon decoding, end of RS block closure bit decoding errors are avoided. LSB limit value 490 can be generated, for example, from the convolutional constraint length in parameter registers section 410 and may be applied as an initial value prior to processing a stream of user data using RS/LSB limit comparator 454.

A TCM counter 492 is initialized prior to encoding a user data symbol stream. This value corresponds to the number of TCM symbols that will result from encoding an entire user data stream according to the set of configuration parameters as reflected by parameter registers section 410. The TCM symbol count is itself one of the configuration parameters. The TCM counter can be initialized from a TCM block count input 494. The TCM counter value controls the sequencing of the TCM encoding and provides an end of TCM block criterion for the termination of each sequence of TCM symbols. As a parameter value, the TCM symbol count can be calculated from other configuration parameters and represents the exact number of TCM symbols produced from a user data stream of specific length according to the set of configuration parameters. The TCM counter, for example, provides the end of sequence criterion to CPU 412. The TCM counter provides a measure of the exact number of symbols to be passed in a particular transfer. This counter may be initialized with that number and count down to zero, or the counter may be initially cleared and count up to the anticipated value. Either way, the TCM counter provides an end of sequence signal to the system.

TCM block count input 494 is driven from the value of TCM codeword length that is provided in parameter registers section 410 and supplies a TCM block count value with which TCM counter 492 is initialized prior to encoding a user data symbol stream.

Limit logic 456 is controlled by RS/LSB limit comparator 454, as described above, and either allows pre-encode LSBs from the LSB buffer to pass unmodified to the Convolutional Encoder, or selectively forces the convolutional encoder input LSBs to zeros in the zero stuffing procedure that is described above for purposes of providing an end of sequence indication for terminating an overall RS symbol transfer. For purposes herein, it is noted that the components following the output of Reed Solomon encoder 402 up to and including MSB Buffer 440 and limit logic 456, and associated components, may be referred to as a packing arrangement 496. Components including mapper 450, convolution encoder 300 and associated components may be referred to as a mapping arrangement 498. The packing arrangement may be referred to as producing a re-blocked output data stream such that at least one portion but not all of the re-blocked output data stream is configured to be subject to a code efficiency based on a convolutional code. Moreover, the packing arrangement is adapted to modify the re-blocked output data stream to support changes in the code efficiency of the convolutional code which is associated with a predetermined number of Reed Solomon symbols in the input stream based on changing one or more values of one or more input parameters that are provided to the packing arrangement.

Referring to FIGS. 1 and 4, microprocessor/CPU 412 can be provided in any suitable form such as, for example, in the form of an embedded control with the processor being dedicated to operating encoder 20, decoder 22 (FIG. 1) and NV memory 14 (FIG. 1) under direction from host 12 (FIG. 1) and serves as an execution platform for firmware 480. Firmware 480 is the software component of one embodiment using an embedded controller. The firmware implements control of encoder 20 (FIG. 1), decoder 22 (FIG. 1) and NV memory (FIG. 1) under direction from host 12 (FIG. 1).

Referring to FIG. 4, parameter registers section 410 can constitute a group of registers accessible by microprocessor 412 under control of firmware 480. The values stored in these registers act to define encoding configurations and control the action of the encoder via CPU 20 and firmware 480 or via registers that are directly accessible to some components of the encoder. It is noted that some of the register parameters have been described in the context of the discussions above. For purposes of providing still further clarity, however, parameter register section 410 will be described in additional detail immediately hereinafter.

Parameter values shown in parameter registers section 410 of FIG. 4 are further described as follows:

User Data Length: The length (in bytes) of a user data block or unit length of user data. By way of non-limiting example, suitable User Data Lengths include 512 bytes, 1024 bytes, or any other suitable length that is supported by a particular embodiment of encoder/decoder.

RS Correction Capacity: Also referred to as "T", defines a maximum number of RS symbols that the RS error correcting code is capable of correcting in a single codeword. This value multiplied by two defines the number of parity symbols in each RS codeword.

RS Data Length: The length of a user data block after it has been converted from bytes to RS symbols. As such, there is a direct relationship between the user data length and the RS data length. However, because bits must be added to the converted RS symbol stream if the user data stream does not map into an integral number of RS symbols, the RS data length is normally maintained in the parameter registers section as an independent value.

RS Parity Length: The number of RS parity symbols appended to RS data length in order to construct a single RS codeword. The value of RS parity length is directly implied by the value of RS correction capacity (T). Embodiments may maintain this value in an independent register or its value can be derived from RS correction capacity (T).

RS Interleaving Factor: Common practice in the application of RS coding is to encode and decode more than one RS codeword per RS block by interleaving. Such interleaving is shown, for example, in FIGS. 12 and 13 of the above incorporated '546 Application. If interleaving is present in the configuration, the value of this parameter is a simple integer. Because interleaving may be constrained by a particular embodiment, there may be a relatively small limit on the number of interleaves. If interleaving is defined for a particular embodiment, the values of RS data Length, RS parity length, and RS codeword length may apply to the respective lengths of the combined interleaves, or these values may reflect the respective lengths of single interleaves. Such variations with respect to handling of interleaves are embodiment dependent.

Convolutional Constraint Length: If the convolutional encoder is programmable (as is embodiment 300 of FIG. 3), then the value of the convolutional constraint length (K) may be programmable and stored in the parameter registers section. If, on the other hand, the convolutional encoder is configured for a fixed constraint length, then there may be no need to register the value of K.

First Convolutional Polynomial: The first one of two convolutional polynomials used by the convolutional encoder. See FIG. 3 for illustration and explanation of how convolutional polynomials are used by a convolutional encoder.

Second Convolutional Polynomial: The second one of two convolutional polynomials used by the convolutional encoder. See FIG. 3 for illustration and explanation of how convolutional polynomials are used by a Convolutional Encoder.

First Puncture Polynomial: The first one of two puncture polynomials used by the convolutional encoder. See FIG. 3 for illustration and related explanation of how puncture polynomials are used by a convolutional encoder.

Second Puncture Polynomial: The second one of two puncture polynomials used by the convolutional encoder. See FIG. 3 for illustration and related explanation of how puncture polynomials are used by a convolutional encoder.

Bit Density Setting: Denotes the bit density setting in the current operational configuration. Generally, the value is a simple integer representing the number of data bits stored per memory cell. However, when using a fractional bit-per-cell setting (e.g., 3.8), the value can be other than a simple integer. In such a case, the bit density setting is provided based on encoded values that are interpreted by logic. For example, an average bit density setting of 3.5 bits-per-cell can be achieved by programming one-half of the memory cells at 3 bits-per-cell and the other half of the memory cells at 4 bits-per-cell. The use of TCM encoding such as shown in FIG. 2, normally uses at least 3 bits per cell for the bit density setting. Fractional bit coding will be discussed in further detail at an appropriate point hereinafter.

MSB width in TCM: The number of MSB bits in each TCM symbol. The value of the bit density setting gives the width of the entire TCM symbol, except for fractional bit density settings in which case the TCM value presented to each storage cell is the next highest integer value rounded up from the bit density setting. The number of MSB bits, then, is that proportion of the TCM symbol allocated to the MSB part of the symbol. The MSB width in TCM is the difference between the TCM symbol width and the number of LSBs. For example at four bits per TCM symbol, with a single bit for the LSB portion of the symbol, the MSB width as part of the TCM width is 4−1=3.

LSB width in TCM: The number of LSB bits in each TCM symbol. the value of the bit density setting gives the width of the TCM symbol itself, except for fractional bit density settings in which case the TCM value presented to each storage cell is the next highest integer value rounded up from the bit density setting. The number of LSB bits, then, is that proportion of the TCM symbol allocated to the LSB part of the symbol. The LSB Width in TCM is the difference between the TCM symbol width and the number of MSBs. For example, at four bits per TCM symbol, with 3 bits for the LSB portion of the symbol, the LSB width in TCM value is 4−3=1.

TCM Codeword Length: Total number of TCM symbols making up an encoded user data length of bytes according to the configuration defined by a particular combination of the parameters described above. Because the value of TCM codeword length is a function of the RS and convolutional code parameters, its can be stored in an independent register as part of the parameter registers section.

It should be appreciated that the code efficiency is established by the combined values of the parameters given by parameter registers section 410. Hence, by modifying one or more parameter values in the parameter registers section, the code efficiency will change in response to the change in parameter values. Applicants are not aware of any system for use with nonvolatile memory which provides the flexibility to modify the code efficiency as quickly as on a codeword-to-codeword basis. Such flexibility enhances the operation of the system, for example, with respect to data throughput, memory storage capacity and accommodation of memory degradation over time. Generally speaking, higher bit density can be achieved by adding redundancy. The latter tends to be greater with higher RS capacity settings and less puncturing. Higher densities are generally correlated with higher redundancies. Accommodation of memory degradation can generally be achieved with higher redundancy but with lesser emphasis on density such that more powerful encoding and decoding settings can offset the higher tendency to errors exhibited by memory that is affected by degradation.

Table 1, below, provides simulation examples using parameter values that establish the TCM codeword length. The parameters include Bit Density, number of User Bytes, Number of RS interleaves, T (RS correction capacity), Number of RS data symbols, Number of RS parity symbols, the convolutional polynomials, and the puncture polynomials, number of MSBs and the TCM codeword length. Note that the constraint length is the same as the number of coefficients in the convolutional polynomials. In these examples, there are 6 coefficients (bits) in the convolutional polynomials, so the constraint length of the convolutional encoder/decoder is 6.

TABLE 1

| Parameter Name | Example 1 | Example 2 |
| --- | --- | --- |
| Bit Density | 4 | 3 |
| User Data Length | 2048 | 2048 |
| Number of Interleaves | 4 | 4 |
| Soft T | 10 | 10 |
| RS Data Length | 1639 | 1639 |
| RS Parity Length | 80 | 80 |
| First Convolutional Polynomial | 110101 | 110101 |

TABLE 1-continued

| Parameter Name | Example 1 | Example 2 |
| --- | --- | --- |
| Second Convolutional Polynomial | 101111 | 101111 |
| First Puncture Polynomial | 111111 | 111111 |
| Second Puncture Polynomial | 101010 | 101010 |
| Number of MSBs | 3 | 2 |
| TCM Codeword Length | 4690 | 6305 |

These simulation examples were carried out using a model of encoder and decoder configurations with the parameters as specified in Table 1. In view of the details provided here, it is considered that one of ordinary skill in the art may readily determine the TCM codeword length in terms of its dependence on any influencing parameters.

Figure 5:
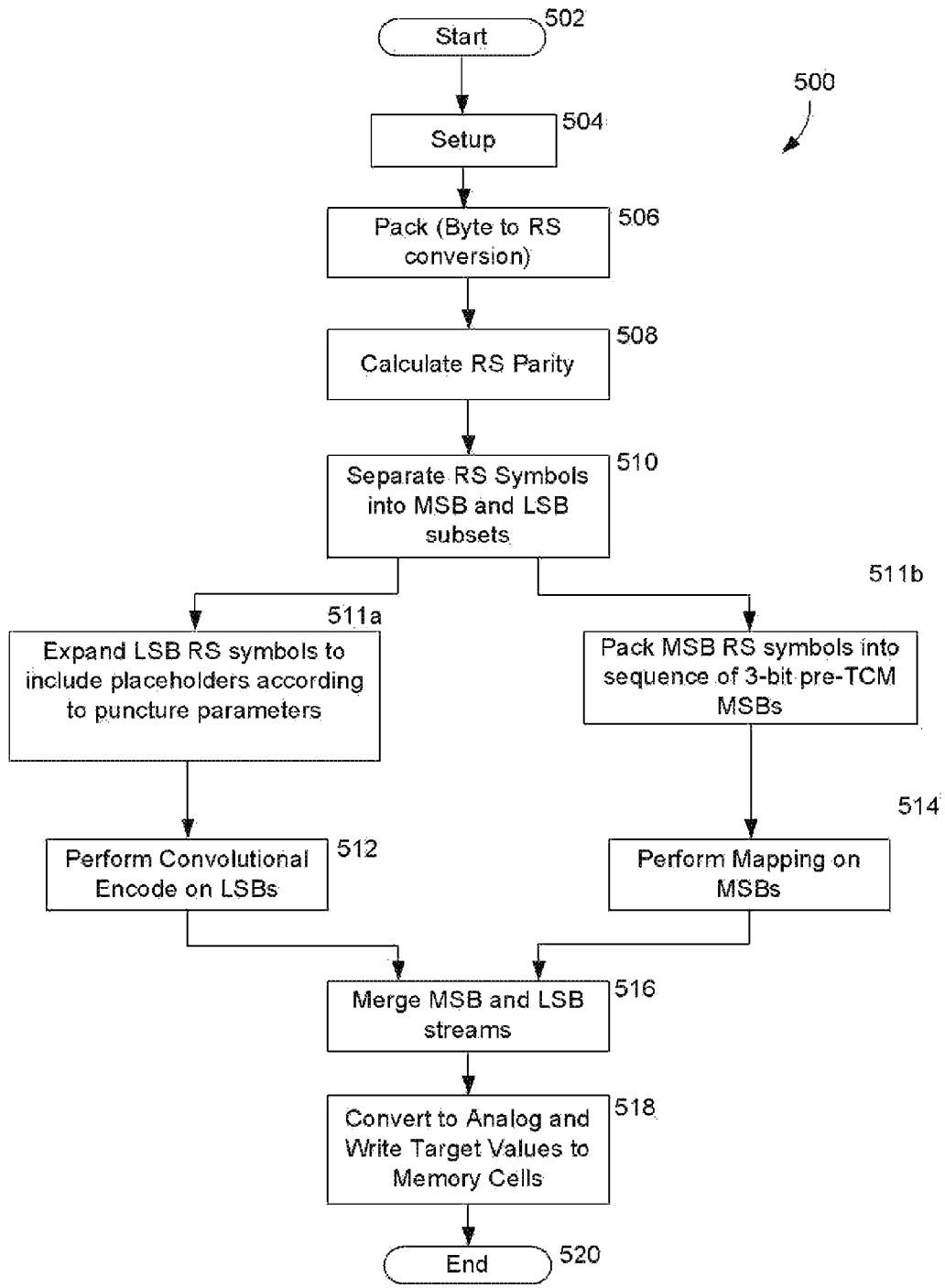
FIG. 5 is a flow diagram which illustrates one embodiment of an encoding method that is operable by the encoding section of FIG. 4.

FIG. 5 illustrates one embodiment of a method, generally indicated by the reference number 500, that is operable on encoder 20 of FIG. 4 and which is equally applicable to other embodiments. For example, method 500 is applicable to embodiments that use bit densities other than 4 bits per cell.

Method 500 begins at start step 502 and proceeds to setup 504. In step 504, the various parameters can be loaded into parameter registers section 410 of FIG. 4 as well as any other desired register locations. It should be appreciated that some of the parameters may be user specified such as, for example, User Data length, RS Correction Capacity while other parameters such as, for example, RS Parity Length can be determined on the basis of user specified parameters. Data flow, as handled by method 500, begins with user data having units of the user data typically in 8-bit bytes. The result of method 500, as will be seen, is in the form of TCM-encoded values with each of these values representing the target value for one cell of the storage medium. Output values are a function of the configuration of the encoder based on 3 bits per cell or more.

At packing step 506, user data of length 'User Data Length' (see parameter registers section 410 in FIG. 4) is converted into 'RS Data Length' (see parameter registers section 410 in FIG. 4) made up of RS Symbols. If the 'User Data Length' user data symbols do not map into an integral number of 'RS Data Length' RS symbols, bits of known value (i.e. all zeros or all ones) are inserted into an unmapped portion of the last RS symbol. Thus, a stream of RS symbols is produced.

Step 508 initiates handling of the stream of RS symbols by initially determining an RS parity value. The RS symbols of length 'RS Data Length' obtained from step 506 are encoded by calculating 'RS Parity Length' (see parameter registers section 410 in FIG. 4). RS Parity calculation is well understood by those of ordinary skill in the art. If the configuration specifies more than one interleave via the RS Interleaving Factor (see parameter registers section 410 in FIG. 4), RS parity symbols are calculated for the number of interleaves given in the configuration. The output resulting from step 508 is a set of RS symbols with length 'RS Data Length' plus 'RS Parity Length'.

Step 510 separates the RS symbols resulting from step 508 into an MSB subset and an LSB subset. The LSB subset is subsequently then processed by step 511a while the MSB subset is subsequently processed by step 511b. In the exemplary case of 4 bits per cell bit density, MSB and LSB symbols are created in a proportion to one another in a manner that is consistent with FIG. 2.

Step 511a expands the LSB symbols by calculating placeholder positions which provide for additions that will be made to the LSB bit stream by convolutional encoding at step 512. Placeholder positions can be determined as described with respect to FIG. 3. The placeholder creation operation creates empty bit positions in addition to LSB data taken from the LSB RS symbols.

Step 511b packs LSB RS symbols into a set of 3-bit MSB fields, with each MSB field corresponding to one TCM symbol. At this point, the 3-bit fields have not yet been encoded At the conclusion of packing by step 511c, the total number of 3-bit fields that is created is equal to the total number of LSB bits with the addition of the placeholders.

RS symbols resulting from step 508 are packed by step 510 into a pre-encode TCM format which inserts the X placeholders seen in the LSBs of FIG. 2. This step converts the set of RS Symbols into a 'TCM Codeword Length' (see parameter registers section 410 in FIG. 4) number of pre-encoded TCM Symbols. "Pre-encode" in this context refers to the format of the TCM symbols, each with a MSB portion and an LSB portion but which have not yet been formatted by the MSB mapping section 450 and convolutional encoding section 300 of FIG. 4. As such, the LSBs are in the form of a series of un-convolutionally-encoded data bits intermixed with X placeholders.

Steps 512 and 514 operate cooperatively responsive to step 510. In step 512, convolutional encoding is performed (see item 300 in FIGS. 3 and 4) on the 'TCM Codeword Length' (see parameter registers section 410 in FIG. 4) LSBs in order to produce 'TCM Codeword Length' convolutionally encoded LSBs. That is, the X designators of the LSBs in FIG. 2 are replaced by code bits. If the configuration via the 'Bit Density Setting', 'MSB width in TCM', and 'LSB width in TCM' (see parameter registers section 410 in FIG. 4) specifies more than one LSB per TCM symbol, then an appropriate encoder arrangement can be specified with which to encode more than one LSB per timing increment. For example, bits $b_0$ and $b_1$ of FIG. 2 could both be subject to convolutional encoding. Step 512 produces a stream of LSB symbols having the number 'TCM Codeword Length' (see parameter registers section 410 in FIG. 4) as the number of LSB symbols in the stream. The LSB symbols are of width 'LSB Width in TCM' (see parameter registers section 410 in FIG. 4). It should be appreciated that for the case of one LSB (i.e., $b_0$ being the only LSB as shown in FIG. 2), the LSB symbols are each made up of one bit.

In step 514, MSB mapping is performed by transforming the value of each MSB into a transformed value targeted for TCM encoding. Per FIG. 2, as described above, three-bit MSBs are exemplary and any other suitable grouping may be used within the scope of the present disclosure. The mapping, in the present example, is from one three-bit value into another three-bit value that conforms to the criteria for TCM encoding, as will be understood by one having ordinary skill in the art with this overall disclosure in hand. Here, the incoming three-bit values, as an optional step, are treated as Gray coded values and mapped into binary values (see mapper 450 in FIG. 4). The mapping function, in embodiments that fall within the scope of the present disclosure, may be via logic gates or implemented using a look-up table. Other variations may be implemented for this mapping function. Step 514 produces a stream of MSB symbols of length 'TCM Codeword Length' (see parameter registers section 410 in FIG. 4). Each MSB symbol is of a width corresponding to 'MSB width in TCM' (see parameter registers section 410 in FIG. 4).

In step 516, convolutionally encoded LSBs from step 512 and the mapped MSBs from step 514 are merged into a single stream of encoded TCM symbols having a length that corresponds to the value of 'TCM Codeword Length' (see parameter registers section 410 in FIG. 4). The encoded TCM symbols are of a width that corresponds to the value of 'Bit Density Setting' (see parameter registers section 410 in FIG. 4). The output symbols from this step are target levels to be applied to individual cell locations in the memory. As described above with regard to FIG. 4, an additional scaling of the level may be applied to the encoded symbols. However, this scaling is optional and may or may not be applied.

Step 518 converts the target levels to analog values which are written to individual ones of the memory cells and the method ends at 520 for restart subject to a subsequent data operation.

Figure 6:
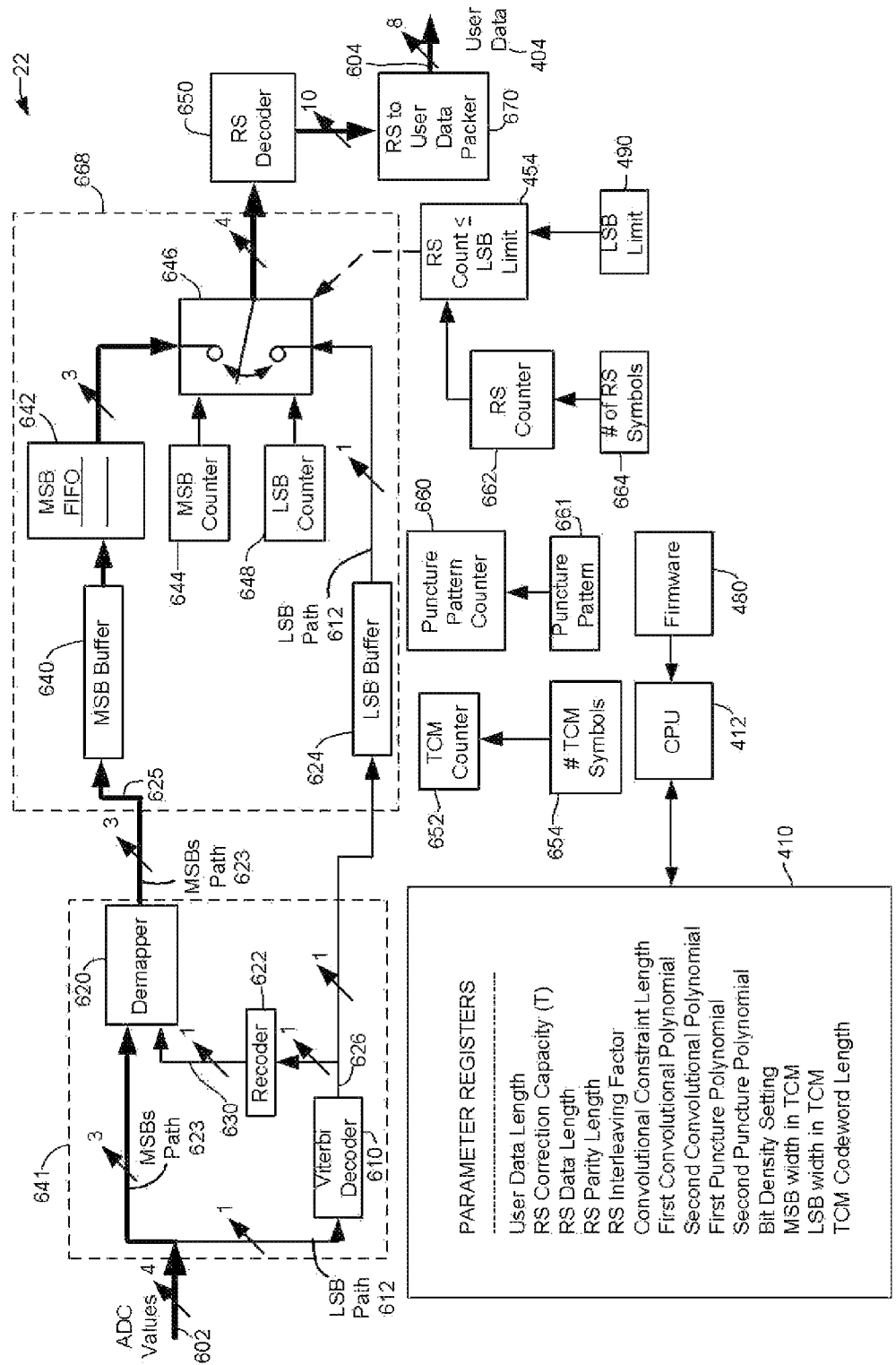
FIG. 6 is a block diagram illustrating details with respect to the decoding section of the system of FIG. 1.

FIG. 6 is a block diagram of one embodiment of decoder 22 of FIG. 1 produced according to the present disclosure. Generally, decoder 22 reverses the transformations of encoder 20 of FIG. 4 in such a way that not only is the original user data obtained as a result, but that errors encountered during the reverse process (decoding) are detected and eliminated. It is considered that other embodiments can be produced by one of ordinary skill in the art in view of this overall disclosure.

The decoder, as shown in FIG. 6, receives TCM symbols on an input 602. TCM symbols are values produced by Analog to Digital conversion of voltages sensed as the result of reading the memory. Input 602 receives the ADC values since these values are produced by an analog to digital converter (not shown) which produces each ADC value responsive to reading a memory cell. The Analog to Digital Conversion function is often located in NV memory 14, as shown in FIG. 1, however, some embodiments may locate the Analog to Digital Conversion function in decoder 22. While FIG. 6 does not show the memory itself, the arrangement of the memory relative to the decoder is the same as that shown in FIG. 1 in which there is an input connection relative to decoder 22 from NV memory 14. This connection may be understood to include provisions for multiplexing such that the complete extents of the memory are accessible. It should be appreciated that the ADC values are, in fact, TCM symbols that are stored according to the data structure of FIG. 2. Thus, a series of ADC values represents a stream of TCM symbols, as read from the data structure of FIG. 2, and which is to be subject to decoding. Post-decoding, a stream of user data symbols emerges on an output 604 on the right side of the figure.

An embodiment of an encoder that is configured in a particular way for storing data in memory 14 will, upon read back of that data, result in presenting the decoder with a specific number of TCM symbols each with a specific number of bits. Controlling parameters for the read back are, therefore, the same as those discussed relative to FIGS. 2 and 4. Although the embodiment of FIG. 6 is exemplary and depicts a configuration with four-bit per cell density and one LSB bit per TCM symbol, one may configure other decoder embodiments, within the scope of the teachings herein, to operate with other bit density settings (e.g., 3 bits per cell, or 5 bits per cell), and with more than one LSB bit per TCM symbol. Moreover, embodiments according to the present disclosure can accommodate many possibilities for the length of an input stream of TCM symbols. This flexibility is provided, at least in part, by configuring a particular embodiment of the decoder responsive to parameters such as, for example, the parameters provided by parameter register section 410. In this regard, it should be appreciated that parameter values can change on-the-fly responsive to an incoming symbol stream at least as often as from codeword to codeword for purposes of either encoding or decoding, as will be further discussed at an appropriate point hereinafter.

A given decoder embodiment may impose limits on the ranges of some controlling parameters such that the decoder is capable of supporting some data configurations, but not others. Thus, a particular decoder embodiment can be designed to target specific data configurations and may disregard others. For example, a decoder embodiment may support three bit per cell and four bit per cell density settings but not five or more bit per cell density settings. Functionality that differs in this way from one decoder embodiment to another, however, manifests a common approach to error correction that falls within the scope of the teachings herein and consequently manifests like benefits.

Referring to FIG. 6 a Viterbi Decoder/Detector 610 receives LSBs on an LSB path 612 from the incoming stream of TCM symbols that result from analog to digital conversion of cell values read from the memory. Such a Viterbi detector will be familiar to one having ordinary skill in the communications engineering arts and these descriptions will therefore not be repeated here for purposes of brevity. Each of the TCM symbols received from the analog to digital conversion have the same structure as the original encoded stream (see FIG. 2), except that additional bits can be appended to the Least Significant portion of each symbol. These additional bits result from high resolution Analog to Digital conversion and provide additional bits of precision relating to each LSB. In other words, the TCM symbols can be read back with a higher bit resolution than the resolution at which they were written. These additional bits are termed "soft bits" and are used by the Viterbi detector to sense each LSB's value with more resolution than would be possible without the soft bits. Some embodiments of Viterbi detectors, that use soft bits, may use three or four additional bits, but greater or fewer may be used. It should be appreciated, however, that the use of soft bits is not required in order to achieve many of the benefits disclosed herein, but error correction performance is still further enhanced with the use of such soft bits. An embodiment of the Viterbi detector hardware may be designed for one particular decoding configuration or may support more than one decoding configuration in which case the Viterbi detector can be parameterized through various registers in parameter registers section 410, as programmed by microprocessor 412 via firmware 480. Regardless of whether fixed with respect to configuration or programmable, a Viterbi detector embodiment includes first and second convolutional polynomials and first and second puncture polynomials, all of which are available in parameter registers section 410. The convolutional polynomials determine a decoding lattice implemented in the Viterbi detector, and the puncture polynomials identify a bit subset in the LSB stream relative to the non-puncture bit stream that would have been generated by a convolutional encoder (convolutional encoder 300 of FIGS. 3 and 4, in the present example) in the absence of the use of puncture polynomials. The Viterbi detector produces, as its output, a decoded bit stream that reflects the content of the original LSB stream that was presented to the encoder. From a practical standpoint, some bit errors will have occurred in the TCM LSB stream, and in keeping with the Viterbi detector's behavior as an error-correcting decoder, some of these bits will have been corrected by the Viterbi detector. Other bit errors, however, can be passed, and it will then be the task of subsequent functions in the decoder to detect and correct these pass-through errors.

A demapper 620 converts the MSB stream received from analog to digital conversion on an MSB path 623 back into pre-encode MSBs form. For example, if Gray to binary coding was applied by the encoder, the demapper converts back to Gray code form. The demapper also provides a reversal of Level to DAC function 472 of the encoder (see FIG. 4). It should be noted that the convolutionally decoded LSBs from Viterbi decoder 610 are directed to a recoder 622, yet to be described and to an LSB buffer 624. Because Level to DAC 472 can provide the option of scaling of encoded TCM symbols to cell target values, the decoding process accuracy can be enhanced when using read back values that reflect, as near as possible, the original cell targets in order to obtain a suitably error error-free TCM decode. A combination of the MSBs from the ADC values and from recoder 622 provide input values to the demapper that allow such enhanced accuracy. An output 625 of the demapper is demapped MSBs. LSBs for decoded TCM symbols are taken from a Viterbi decoder output 626.

Recoder 622 reconstructs what is intended to be an original encoded bit stream based on the result provided by Viterbi decoder 610. Because some occasional errors could be present in the Viterbi detector output, a recoded stream at 630 might be an approximation of the original encoded bit stream. It is desired to obtain, as closely as practical, the original encoding of the LSBs of the convolutionally encoded LSBs in order to find a suitably accurate inverse transformation for the forward transformation that was initially performed by Level to DAC 472 of FIG. 4. Stated in a slightly different way, Viterbi decoder 610 applies error correction to the incoming LSBs, taken from the ADC values, such that decoded LSBs on output 626 of the Viterbi decoder more accurately reflect the original error-free LSBs on the encoder side. Recoder 622 is essentially another convolutional encoder 300 (see FIGS. 3 and 4) that regenerates the LSBs including code bits for use by demapper 620 in more accurately regenerating the MSBs. Thus, the original convolutionally encoded LSBs, including code bits, are provided by recoder 622 to demapper 620 at least within the accuracy limitations of the components. The demapper generates MSBs on output 625 based on the incoming MSBs and the convolutionally encoded LSBs from recoder 622. The components in the MSB and LSB data path including demapper 620, Viterbi decoder 610 and recoder 622 may be referred to as a demapping arrangement 641.

An MSB buffer 640 receives the demapped MSBs from the output of demapper 620. This latter buffer stages MSB bits in the decoded MSB stream and forwards them to an MSB FIFO 642 as the MSBs are requested responsive to an MSB counter 644. MSB buffer 640 outputs RS symbol-sized groups of bits to MSB FIFO 642 each time MSB counter 644 requests an MSB RS symbol by counting off 10 bits of accumulation to the MSB buffer. The RS symbol sized groups correspond directly to RS symbols as originally created during the encoding function in FIG. 4. The 4-bit per cell configuration illustrated in FIG. 6 utilizes the MSB buffer as being 3 bits wide (as is consistent with FIG. 2), but this is exemplary and other widths may be established for this buffer (and for the rest of the related data path) depending on parameter settings for MSB width. Likewise, the RS symbol width is 10 bits (as seen in FIG. 2) but embodiments with other RS symbol widths (and other packing arrangements) may be used in the conversions from RS symbols to TCM symbols and from decoded TCM symbols back to RS symbols.

LSB buffer 624 receives the decoded LSB stream from Viterbi detector 610. This buffer stages LSB bits and outputs bits to multiplexer 646 whenever an LSB counter 648 requests additional LSB bits. LSB Counter 648 controls the operation of multiplexer 646. Whenever the LSB counter counts 10 bits of accumulation into the LSB buffer, the multiplexer sends an LSB RS symbol from the LSB buffer through multiplexer 646 to RS Decoder 650. At all other times, MSB RS symbols are accumulated into MSB FIFO. Immediately after an LSB RS symbol is transferred through multiplexer 646 to RS Decoder 650, the contents of the MSB FIFO are transferred through multiplexer 646 to RS Decoder 650. Because multiple MSB RS symbols will comprise this transfer, MSB RS symbols can be transferred out of the MSB Buffer one symbol per clock interval until all available symbols have been transferred through multiplexer 646 to RS Decoder 650. While in the embodiment of FIG. 6, the LSB buffer is one bit wide, embodiments of widths of greater than one bit may be established for this buffer (and for the rest of the related data path) depending upon parameter settings for LSB width.

Under control of MSB counter 644, MSB FIFO (First In First Out) 642 receives RS symbols from MSB buffer 640. These symbols, as re-assembled in the MSB FIFO are the same as the RS MSB symbols originally created in encoder 20 of FIG. 4 from the user data input stream and by the action of RS Encoder 402 (FIG. 4). The MSB FIFO assures that all RS symbols returned by the TCM portion of the decoder are reassembled in the same sequence with which they were dispatched to the TCM encoder during the encoding process. Because the MSB data path, in some embodiments, operates at a faster data rate (3 MSB bits per TCM symbol versus less than 1 bit per LSB bit with puncturing), the MSB FIFO provides an RS symbol management function. In the data structure embodiment of FIG. 2, there are points in the sequence where LSB symbol boundaries and MSB symbol boundaries coincide with TCM symbol boundaries. In the encoding mode, an arbitrary decision can be made whether to transmit an LSB RS symbol or an MSB RS symbol to the TCM encoder: either the MSB RS symbol may be sent first or the LSB symbol may be sent first. Either case can be effective, but in the decoding mode, the reconstruction sequence must be exactly the same as the sequence produced by the encoding mode. The MSB FIFO allows temporary storage of the relatively fast moving MSB symbols so that MSB RS symbols can be selected in the proper order. In this regard, it should be appreciated that the MSB RS symbols cannot simply be transferred to the RS decoder upon completion since MSB RS symbols are completed at a faster rate than LSB RS symbols, resulting in an incorrect reconstruction sequence. For example, as described above with regard to FIG. 2, RS2-RS5 are completed before RS1 is completed. Thus, the MSB FIFO would retain RS2-RS5 until RS1 is complete. RS1 is transferred to RS decoder 650 before the transfer of RS2-RS5 to decoder 650. The MSB FIFO receives an additional RS MSB symbol from the MSB buffer each time an RS symbol length of bits is acquired by the MSB buffer, and sends an RS MSB symbol to multiplexer 646 each time multiplexer 646 enables the path from the MSB FIFO to RS decoder 650, which occurs under control of the MSB and LSB Counters so as to maintain the correct sequence of RS symbols at RS decoder 650.

MSB/LSB symbol multiplexer 646 merges reconstructed RS symbols from MSB FIFO 642 and LSB buffer 624 representing both MSB and LSB portions, respectively, of post-decode TCM symbols generated by Viterbi decoder 610 and demapper 620. Reconstructed RS symbols are produced by MSB FIFO 642 and LSB Buffer 624, as described above. Under control of MSB counter 644 and LSB counter 648, 10-bit quantities are selected from the MSB FIFO output and the LSB buffer output and merged into a sequence of RS symbols that are intended to identically match the sequence originally produced by the RS encoding functions of encoder 20 of FIG. 4.

MSB counter 644 is an up counter that counts up until a complete MSB RS Symbol is available from MSB FIFO 642. When a complete MSB RS symbol is available, the MSB counter signals multiplexer 646 and the ten bit symbol is transferred to an RS decoder 650 via the multiplexer. For each time increment t, three MSB bits are available to multiplexer

646. The MSB counter therefore increments by a value of three per time increment. Since each RS MSB symbol, in the present embodiment, is made up of ten bits, the MSB counter will require 4 time increments to initially allow the accumulation of a complete RS symbol in MSB FIFO 642. At this point, the count is 12. The counter signals the availability of a complete MSB RS symbol to multiplexer 646 and decrements its count by 10 such that the current count is 2. Because 4 time increments accumulates a total of 12 MSB bits, two bits are left over for allocation to the next MSB RS symbol. Accordingly, 3 time increments then provide an additional 9 bits such that 11 bits are available with 1 of these bits being leftover for the next MSB RS symbol. At this point, the count is 11. The counter signals the availability of a complete MSB RS symbol to multiplexer 646 and decrements its count by 10 such that the current count is 1. With 1 bit left over, the next three time increments will provide 9 bits to provide a complete MSB RS symbol along with the one leftover bit. At this point, the count is 10. The counter signals the availability of a complete MSB RS symbol to multiplexer 646 and decrements its count by 10 such that the current count is 0. Accordingly, this process repeats with the MSB counter decrementing its count by 10 each time it signals the availability of a complete MSB RS symbol to multiplexer 646. In an embodiment in which there are two MSBs per memory cell, the MSB counter would increment by 2 per time increment. Similarly, in an embodiment in which there are four MSBs per memory cell, the MSB counter would increment by 4 per time increment.

LSB counter 648 counts up in a manner that resembles the count of the MSB counter with the exception that the LSB counter increments by a value of 1 per each time increment. Thus, the LSB counter indicates the availability of a complete LSB RS symbol responsive to each ten time increments. The LSB counter then resets to zero and counts anew to the value of ten. When a complete LSB RS symbol is available, the LSB counter signals multiplexer 646 and the ten bit symbol is transferred to RS decoder 650 via the multiplexer. When the LSB counter and the MSB counter simultaneously indicate the availability of an RS symbol, multiplexer 646 gives priority to the LSB RS symbol and takes that symbol first in order to reconstruct the original stream of RS symbols. In an embodiment in which there are two LSBs per memory cell, the LSB counter would increment by 2 per time increment. Similarly, in an embodiment in which there are three LSBs per memory cell, the LSB counter would increment by a value of 3 per time increment.

A TCM counter 652 is initialized with the value of 'TCM codeword length' that is equal to a number of TCM symbols 654 that represents the exact number of TCM symbols making up the transfer that is about to be performed. The number of TCM symbols can also be obtained directly from parameter registers section 410 before the decode begins receiving a stream of ADC Values. The count of the TCM counter is decremented by one for each TCM Symbol decoded. When the count goes to zero, an indication of the end of the decoding process for the current block is indicated to CPU 412 such that the end of the sequence has been reached. Depending on the embodiment, this event may enable action by CPU 412 to set up another encoding sequence that may or may not require parameter registers section 410 to be re-loaded. It is noted that the current count value of the TCM counter as well as the transition to zero, are both used as control indications by the TCM counter. For example, values greater than zero denote progress of a sequence relative to the total length denoted by 'TCM codeword length', and the transition to zero indicates sequence completion.

A puncture pattern counter 660 is initialized with a value 661 that is either directly obtained or derived from the first puncture polynomial and the second puncture polynomial stored in parameter registers section 410. The puncture pattern counter value, for decoding purposes, is used to identify to the Viterbi decoder how to handle each bit in the received LSB stream. That is, whether a given bit is a data bit or a code bit. The puncture pattern counter count is also used by recoder 622 to reconstruct the recoded LSB stream used by demapper 620.

An RS counter 662 can be initialized with the number of symbols in an RS codeword before decoder 22 begins receiving a stream of ADC Values. The number of symbols can be initialized in an RS symbol number register 664, the value of which is either directly obtained from or derived from values stored in parameter registers section 410. Values in parameter registers section 410, which determine the value to be loaded in RS symbol number register 664, include the 'RS data length' and the 'RS parity length', usually as the sum of these two values. These values are in units of RS symbols. As decoder 22 generates a stream of RS symbols, the RS counter counts off RS symbols as they are produced at the output of MSB FIFO 642 and LSB buffer 624. The RS counter produces a signal that denotes end of sequence after the last RS symbol has been counted by way of decrementing to zero in the present embodiment. This condition can be utilized as a termination control for the RS decoder which indicates the end of the current transfer. In other embodiments, the MSB counter, LSB counter and RS symbol counter may be configured to count up or in some suitable combination of up-count and down-count.

RS/LSB limit comparator RS/LSB Limit Comparator 454, in a decoding context, is used near the end of a transfer sequence to confirm that the last bits making up the final LSB RS symbols are zeros. The comparator detects a transition of the RS counter from values greater than the LSB Limit value to values less than or equal to the LSB Limit value. This transition, in turn, causes multiplexer 646 to cooperate in no longer taking bits from LSB buffer 624 and to complete all remaining LSB RS symbols with zero valued bits, as will be further described below with respect to LSB limit 490. The components in the LSB and MSB data paths and supporting components from LSB buffer 624 and MSB buffer 640 up to and including multiplexer 646 may be referred to as an unpacking arrangement 668.

RS decoder 650 receives an RS codeword as the codeword is assembled by multiplexer 646 and preceding logic. The RS decoding operation can proceed once the RS decoder is in possession of a complete RS codeword. The function of the RS decoder is to decode the RS codewords as they are received and to detect and correct any errors that may be present in the received RS symbols. The operation of the RS decoder will be understood by those having ordinary skill in the art with this disclosure in hand. For the moment, it is sufficient to note that the RS decoder is capable of correcting a certain number of symbols within each RS codeword. As previously discussed in this disclosure, an RS codeword is made up of a data portion and a parity portion. The RS decoder uses the parity portion of the RS codeword to detect and remove errors from the data portion. The RS decoder only needs to return the data portion, which corresponds to the original user data submitted to encoder 20 of FIG. 4. The RS decoder produces a stream of RS symbols having a length that is equal to the value of RS data length as identified in parameter registers section 410. Any errors detected by the RS decoder are applied to the output symbols before they are asserted to the output.

When the incoming ADC values were stored with interleaving, multiple RS codewords may be presented to the RS decoder in an interleaved manner. In either a single codeword or interleaved codeword configuration, the value of the RS interleaving factor in parameter registers section 410 defines a particular interleave configuration. RS decoder 650 responds appropriately by decoding the RS Symbol stream it receives as either non-interleaved or as interleaved.

When an interleaved configuration is selected, as evidenced by the RS interleaving factor value being greater than one, the values of 'RS Data Length' and 'RS Parity Length' in parameter registers section 410 correspond to the interleaved lengths. For example, if the RS interleaving factor is 4, 'RS data length' corresponds to the length of four interleaved data portions, and the value of 'RS parity length' is the length of four parity portions. It is noted that FIGS. 12, 13, 15 and 16 of the above incorporated '546 Application illustrate a data structure having four interleaves.

LSB Limit 490 specifies the number of bits in the LSB position that are forced to zero at the end of the decoding sequence. The value of LSB limit 490, as a count value, is denominated in units of RS symbols and is compared with the RS counter value as the RS counter decrements to zero. The value of the LSB limit is generally a small integer and corresponds to the number of RS symbols remaining in the sequence at the point where the final RS LSB symbol(s) zero stuffing begins. An example of this is shown in FIG. 2 where the RS(N−1) symbol occurs. The occurrence of RS(N−1) corresponds to the point where the final LSB symbol bits [in RS(N−7)] are zeros.

The LSB Limit is compared with the value in RS Counter 662 as the RS Counter is decremented for each RS symbol that is supplied to RS Decoder 650. After the RS Counter decrements to a value less than or equal to the LSB Limit, as determined by RS/LSB comparator 454, zeros are inserted into LSB RS symbols sent to the RS Decoder. That is, the point where the equality comparison between the LSB Limit and the RS counter occurs denotes a change in mode of the way LSB symbols are constructed by beginning zero stuffing. While the RS count is greater than the LSB Limit value, bits in RS LSB symbols are filled-in from bits produced by Viterbi decoder 610. After the RS counter becomes equal to or less than the Limit count, as determined by RS/LSB comparator 454, the data bits of additional LSB RS symbols are filled-in with zeros. This continues until the final LSB RS symbol has been filled-in.

Figure 7:
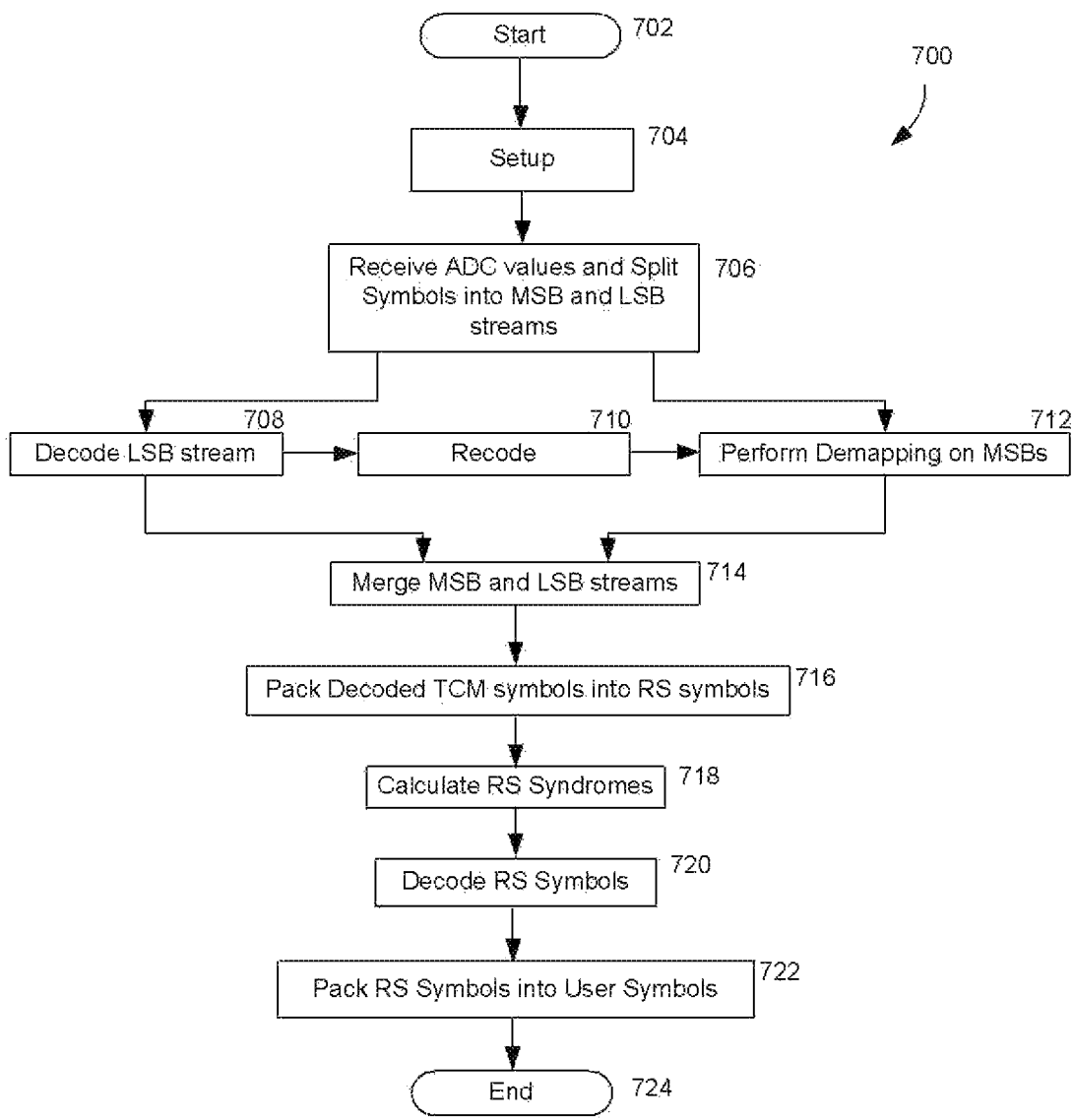
FIG. 7 is a flow diagram which illustrates one embodiment of a decoding method that is operable by the decoding section of FIG. 6.

RS to user data packing 670 is the final section making up the decoding apparatus. The set of RS symbols of length 'RS data length' (see parameter registers section 410) are converted from RS format to user data format. In the embodiment of FIG. 7, this conversion is a conversion from 10-bit symbols to 8-bit symbols, as indicated. Of course, if the RS format is different from 10-bits or the user data format is different from 8-bits then, the conversion would be from the RS symbol format to the user data symbol format based on the definition of these widths in the current configuration.

Firmware 480, as executed by microprocessor 412, directs the operation of decoder 22. In particular, the microprocessor is interfaced with parameter registers section 410. The microprocessor can write values to the registers in enact one of many possible decoding configurations to be applied to the current stream of ADC values supplied to the decoder. The microprocessor, while executing firmware 480 instructions may be instructed to modify values at any time the decoder is not actively decoding a stream of ADC values in order change the programming of the decoder from one configuration to another. In this way, many combinations of all the parameters shown in parameter registers section 410 may be applied to a particular embodiment of decoder 22. As one example, the decoder configuration can be changed to reflect a change in bit density for incoming ADC values.

It is noted that parameter registers section 410 is unchanged with respect to the various values that are stored, irrespective of whether a decoding data operation or an encoding data operation is to be performed. From the perspective of firmware 480, however, the various parameters can be viewed somewhat differently. Hence, the parameters will be discussed immediately hereinafter, at least in part, within the framework of a decoding operation, although additional details may be provided for still further explanatory purposes.

User Data Length: The length of user data that must be applied to the output after decoding. The unit of this value is normally bytes, so user data length means the number of bytes in a unit of user data.

RS Correction Capacity (T): The number of symbols errors the RS decoder is capable of successfully detecting and correcting in one RS codeword. If interleaving is applied, then this value applies to a single interleave, and the total number of symbols that may be corrected by interleaving is this number multiplied by the RS interleaving factor.

RS Data Length: This is the number of RS symbols into which a unit of user data is transformed. If the number of bits in an RS symbol is different than the number of bits in a user data symbol, then this number is different from the 'user data length'. In the context of FIG. 6, the user data symbol unit is a byte and the RS symbol contains 10 bits, so 'RS data length' will be less than 'user data length' in this case by a factor of $8/10$.

RS Data Length: The combined length of all interleaves if the RS interleaving factor is greater than one.

RS Parity Length: The number of RS symbols required for the parity portion of an RS codeword according to the current configuration. This value may be derived from the RS correction capacity, but may be implemented in some embodiments as an independent register value.

RS Interleaving Factor: The number of interleaved RS codewords that make up a length of RS symbols constituting the sum of the 'RS data length' and 'RS parity length' values stored in parameter registers section 410. The number of interleaves is usually a relatively small integer.

Convolutional Constraint Length: The number of bits plus one in the shift register that accepts data in a convolutional encoder (see FIG. 3, shift register 304). Each output bit from the convolutional encoder is some combination of the current input bit to the encoder plus the most recent prior bits in the shift register.

First Convolutional Polynomial: One of two convolutional polynomials. The number of coefficients in this polynomial is the same as the convolutional constraint length. In the decoding case, the First Convolutional Polynomial, establishes the interpretation to be applied by Viterbi detector 610 to those bits in the input stream that occur relative to application of the First Convolutional polynomial. In some embodiments, this polynomial may be applied to implementation features in the Viterbi decoder that select the branch decision configuration corresponding to the particular Convolutional Polynomial. Implementation of features comprising a Viterbi detector are well understood by practitioners of ordinary skill in the practical arts. See for example: Wicker, Stephen B *Error Control Systems for Digital Communications and Storage,* 1995, Prentice-Hall, Chapter 12 (pp. 290-332), which is incorporated herein by reference.

Second Convolutional Polynomial: The second of two convolutional polynomials whose coefficients are used to calculate the second one of two convolutional encoder output bits using the current input bit and the shift register. In the decoding case, the Second Convolutional Polynomial, establishes the interpretation applied by the Viterbi detector to those bits in the input stream that occur relative to application of the Second Convolutional polynomial. In some embodiments, this polynomial may be applied to implementation features in Viterbi decoder 610 that select a branch decision configuration corresponding to the particular Convolutional Polynomial. Implementation of features comprising a Viterbi detector are well understood by practitioners having ordinary skill in the relevant art. See again, for example: Wicker, Stephen B *Error Control Systems for Digital Communications and Storage,* 1995, Prentice-Hall, Chapter 12 (pp. 290-332).

First Puncture Polynomial: One of two polynomials that establishes, in cooperation with the first convolutional polynomial, the interpretation of each input to Viterbi detector 610 with respect to puncturing. As one embodiment to select from more than one possible first Puncture Polynomial, the Viterbi detector may be implemented with the capability to configure Viterbi decoder operation with respect to selection from one of multiple possible puncture polynomials in such a way that the appropriate decoding steps are applied to a punctured input stream in order to reconstruct the appropriate decode sequence. Application of puncturing in the context of Viterbi detection is well understood by practitioners of ordinary skill in the practical arts. See again, for example, Wicker, Stephen B, *Error Control Systems for Digital Communications and Storage,* 1995 Prentice-Hall, Chapter 12 (pp. 290-332). See FIG. 3 for an illustration of how the foregoing is applied with respect to a programmable convolutional encoder.

Second Puncture Polynomial: This is the second of two polynomials that determines puncturing. Along with the second convolutional polynomial, this value establishes the interpretation of each input to Viterbi detector 610. As one embodiment to select from more than one possible Second Puncture Polynomial, the Viterbi detector may be implemented with the capability to configure Viterbi decoder operation with respect to selection from one of multiple possible puncture polynomials in such a way that the appropriate decoding steps are applied to a punctured input stream in order to reconstruct the appropriate decode sequence. Application of puncturing in the context of Viterbi detection is well understood by practitioners having ordinary skill in the practical arts. See again, for example, Wicker, Stephen B, *Error Control Systems for Digital Communications and Storage,* 1995 Prentice-Hall, Chapter 12 (pp. 290-332). See FIG. 3 for an illustration of how the foregoing is applied with respect to a programmable convolutional encoder.

Bit Density Setting: The number of bits stored per cell in the NV memory. Many of the other parameters in the parameter registers section are determined, at least in part, by the value of the bit density setting. It is noted that the advantages attendant to the use of the teachings that have been brought to light herein increase in proportion to increasing bit density at least up to some practical limit with respect to accuracy in resolving different levels that are stored by a memory cell. The bit density setting is the primary determinant to the width of the MSBs, LSBs, and combined TCM symbol data paths in the encoder and the decoder. The decoder of FIG. 6 and the encoder of FIG. 4 are exemplary embodiments with respect to the fact that the bit density setting is four bits. Other encoder and decoder implementations may use 3 bits per cell, in which case the TCM symbol width becomes 3 bits instead of 4 bits. Bit density settings greater than 4 may also be applied. If a Bit Density setting equal to 5 is selected, the MSB portion of each TCM Symbol can be made up of 3 or 4 bits and the LSB section can be made up of 2 bits or 1 bit, respectively. Greater than 1 bit in the LSB portion would then require a convolutional encoder and Viterbi decoder capable of handling 2-bit wide encodings. Application of convolutional polynomials and puncturing polynomials is analogous to the single bit convolutional encoder (see convolutional encoder 300 of FIG. 3).

MSB width in TCM: A value that is subordinate to the bit density settings (see discussion re bit density setting above). Decoder 22 of FIG. 6 uses a bit density setting of 4 with the width of the MSB portion of each TCM symbol equal to 3 bits and the width of the LSB portion of each TCM symbol equal to 1 bit. Other combinations may be used, as described above.

LSB Bit width in TCM: Another value that is subordinate to the bit density setting. Decoder 22 of FIG. 4 uses a bit density setting of 4 with the width of the MSB portion of each TCM symbols equal to 3 bits and the width of the LSB portion of each TCM symbol equal to 1 bit. Other combinations are also suitable, as described, for example with respect to bit density settings above. Other embodiments and configurations may include greater than one LSB as used in the LSB portion of the TCM symbol. In those configurations that do so, the LSB bit width value, as a value programmed by microprocessor 412, specifies a configuration for which each LSB portion is greater than one. A particular embodiment will be capable of a maximum number of LSBs. Some embodiments may only accept a value of one; while others may accept values of 2 or more. It should be appreciated that user specified information (see, for example, step 504, FIG. 5) can include: User Data Length, RS Capacity (T), RS Interleaving Factor, Bit Density Setting, and the Convolutional and Puncture parameters. These items are all variables that can cooperate to determine sequence size, and an accompanying error control overhead. Other or secondary parameters can be derived from these fundamental parameters. The secondary parameters can include RS Data Length, RS Parity Length, TCM length, and constraint length. User selection may not refer to an end user per-se, but does refer to configuration variables that may be determined by considerations related to mode of use that are established based on some external determination that is made, for example, at the time of manufacture of a particular system. It should be appreciated that the various parameters can be organized and interrelated in any suitable manner in view of this overall disclosure.

TCM Codeword Length: The total length of a data transfer unit sent to and/or retrieved from the NV memory. In a given storage configuration, this value is constant and does not vary between the storage (i.e., write) operation and the read operation. It is related to most of the other parameters including 'user data length', 'RS correction capacity', 'RS data length', 'RS parity length', 'RS interleaving factor', 'convolutional constraint length', 'convolutional polynomials', puncture polynomials and 'bit density setting'. It is usually stored by microprocessor 412 as an independent value, and will control the encoder function with respect to transferring exactly the number of TCM values in the TCM codeword.

It should be appreciated that the decoding apparatus and associated method that have been brought to light herein each cooperates to provide all of the benefits, at least some of which are described above, with respect to the ability to change the code efficiency on a codeword-to-codeword basis.

FIG. 7 illustrates one embodiment of a method, generally indicated by the reference number 700, that is operable on encoder 22 of FIG. 6 and which is equally applicable to other embodiments. For example, method 700 is applicable to embodiments that use bit densities other than 4 bits per cell.

Method 700 begins at start step 702 and proceeds to setup 704. In step 704, the various parameters can be loaded into parameter registers section 410 of FIG. 4 as well as any other desired register locations. It should be appreciated that some of the parameters may be user specified such as, for example, RS Correction Capacity and the Convolutional Polynomials while other parameters such as, for example, TCM RS Parity Length and TCM Codeword Length can be determined on the basis of user specified parameters. Data flow, as handled by method 700, begins with ADC values that were read from memory 14 of FIG. 1.

At step 706, ADC values are received from the interface to NV memory (see FIG. 1, item 14). A total of 'TCM codeword length' (specified in parameter registers section 410 of FIG. 6) ADC values are received, with each ADC value corresponding to one TCM symbol. It should be appreciated that the ADC values may be different than the encoded TCM symbols produced by encoding method 500 of FIG. 5 in that the ADC values reflect symbols received by the decoder having appended 'soft bits'. Such a configuration may reflect reading the ADC values at a higher resolution than the resolution at which the values were initially written into the memory. If soft decoding is supported, the number of soft bits can vary, but some embodiments may use anything from 1 bit to 4 bits. If soft bits are used in decoding, numerous embodiments may be used within the scope of the present disclosure. In FIG. 6, which is an embodiment that is provided by way of example, soft bits may number 3 bits in the received ADC values such that a total of 7 bits is received. Soft bits are manifested as "sub-LSB" values where they occupy an arithmetic significance less than the significance of the least significant LSB in the ADC stream. Viterbi decoder 300, if using soft bits, recognizes such soft bits and uses them in its decoding process. Soft bits enhance detection and correction of LSB errors in the bit stream if used. Soft Viterbi decoders are well understood in the related practical arts and, therefore, details relating thereto will not be repeated here for purposes of brevity. The reader in this regard is referred, for example, to Wicker, Stephen B., *Error Control Systems for Digital Communications and Storage*, 1995 Prentice-Hall, pp. 301-305 which is incorporated by reference for additional details.

The result of step 706 is two streams of symbols: a stream of 'TCM codeword length' MSBs each with a width that is defined by the current configuration specified in parameter registers section 410 and a stream of 'TCM Codeword Length' LSBs each with width that is similarly defined by the current configuration. If soft bits are used by the current configuration, they appear as a 'sub-LSB' extension to the LSB field as described in the previous paragraph.

In step 708, the LSB stream, in one embodiment, is interpreted by and decoded by Viterbi convolutional decoder 610, as shown in decoder embodiment 22 of FIG. 6. In the present embodiment, the convolutional decoder may be reconfigurable by programming in order to be capable of decoding different convolutional code configurations defined by the 'convolutional constraint length' value, the first and second convolutional polynomials, and the first and second puncture polynomials, all of which are available in the parameter registers section. Decoding results in a stream of 'TCM Codeword Length' post-decode LSBs. The data bits, as they exist in the decoded bit stream, are bits that the Viterbi decoder selects to be the most likely bits to make up the original LSB bit stream which was previously received by RS to pre-TCM packing step 510 of FIG. 5. Because the stream operated on by decoding has gone through encoding (FIG. 5) and then stored into memory 14 (FIG. 1), the LSB bits submitted to Viterbi decoding step 708, after being separated from the ADC values, may have acquired errors as the stream is interpreted by Viterbi decoding 708. However, the behavior of the decoder is intended to detect and remove some proportion of these errors such that the Viterbi decoder output exhibits a lower proportion of errors than the number of errors that is present at the Viterbi decoder input. In many cases, the Viterbi decoder output will be error free, and no additional error correction is then needed during the remainder of this process. In any case, however, remaining processing steps are available to remove errors that still remain following Viterbi decode at 708.

After step 708, the 'TCM Codeword Length' post-decode LSB symbols are inputs to a recode step 710 that uses the Viterbi decoded LSBs to attempt to reconstruct a 'post-encode' (i.e. encoded) LSB bit stream. That is, recoder step 710 effectively operates as a Viterbi encoding step to regenerate code bits that were initially inserted during encoding process 500 of FIG. 5. The recode step is performed to generate a recode stream for use in place of the original 'pre-decode' LSB stream entering Viterbi decode step 708 for the reason that the recode stream is more error free as compared to the 'pre-decode' stream. As noted, the recoding step resembles a convolutional encoding step in that the same parameters (convolutional constraint length, first and second convolutional polynomials, and first and second puncture polynomials of parameter registers section 410) are applied in a convolutional encoding sequence. The output from recode step 710 is the decoder's best estimate of the original 'post-encode' LSB sequence of 'TCM Codeword Length' LSBs.

Step 712, as executed by demapper 620 of FIG. 6, operates on MSBs generated by step 706 in view of the recode stream that is generated by step 710. The MSBs, at this point in the decoding process, form the MSB portion of 'TCM Codeword Length' specified in parameter register section 410. A demapping transformation of MSB values from an encoded form to the un-encoded form is performed, and is the reverse transformation of step 514 of FIG. 5. Step 712 may be implemented, as is the case with step 514, in terms of logical gates or a look-up table. It should be appreciated that in both the forward and reverse instances, with respect to mapper 450 (FIG. 4) and demapper 620 (FIG. 6) as well as mapping step 514 (FIG. 5) and demapping step 712 (FIG. 7), respectively, a one to one relationship exists between input and output. Every input has one and only one correct output value for both the mapper and the demapper. That is, the relationship between the mapper and demapper are the exact inverse of one another. In the present embodiment, the mapping is a binary to Gray code conversion that can readily be implemented by one having ordinary skill in the art in view of this disclosure. Again, this conversion is performed only if an inverse, Gray code to binary conversion was applied on the encoder side. The use of the recoded LSB stream achieves an improved result by causing the demapping output to more closely match the original MSBs of the original encoded MSB stream produced by step 514 during encoding. The output from step 712 is a set of 'TCM codeword length' MSB symbols.

In step 714, the decode LSB stream is received from step 708 and the MSB stream is received from step 712 for purposes of merging into a single stream of 'TCM Codeword Length' post-decode TCM symbols. At this point, the stream is restored to the same format represented in an exemplary case by FIG. 2 in which a stream of TCM symbols overlays an arrangement of RS Symbols. Further, multiplexer 646 and related operations involving MSB buffer 640, MSB FIFO 642, LSB buffer 624, MSB counter 644 and LSB counter 648 of FIG. 6 accommodate merging of the two streams. The result of step 714 is a stream of TCM symbols, which are output as a sequence of symbols of width 'Bit Density Setting' per parameter registers section 410.

Here, the 'TCM Codeword Length' post-decode TCM symbols are converted to RS representation. The process is the same as the exemplary case shown in FIG. 2. The MSBs and LSBs are converted to their respective RS symbol representation and corresponding bits from both the MSBs and LSBs are replaced into corresponding RS symbols at bit positions such that the exact arrangement of RS Symbols and bits within them as the original un-encoded sequence created by the Encode sequence (see FIG. 6) can be obtained, at least within system capabilities.

At step 716, the merged MSB/LSB stream from step 714 is packed into a reconstructed stream of pre-decode RS symbols. It is noted that this step is implemented through the operation of multiplexer 646 of FIG. 6 selectively feeding into RS decoder 650 from the MSB path and the LSB path. The reconstructed stream resulting from step 716 includes both user data (in RS symbol format) and RS parity symbols. The length of the output stream is the sum of 'RS data length' and 'RS parity length' per parameter registers section 410. The difference between this RS symbol stream and the original pre-TCM-encode RS Symbol stream resides in the potential of the current stream to contain errors remaining responsive to the write and readback process thus-far. Subsequent steps involving RS decoding serve to detect and remove erroneous symbols from the current output symbols.

RS decoding includes steps 718 and 720. Initially, step 718 receives the RS symbol stream generated by step 716 in order to calculate a set of values called syndromes. Syndrome calculation starts with the set of RS symbols of length 'RS Symbol Length' plus 'RS Parity Length' and uses these to calculate the syndromes. Syndrome calculation, as an RS decoding step, is well understood by those of ordinary skill in the art familiar with RS decoding. Accordingly, some details will not be provided for purposes of brevity. It is sufficient to note for present purposes that the number of syndromes is always the same as the number of parity symbols relative to a given size of RS codeword, so the parameter 'RS parity length' applies to management of syndromes. If interleaving is selected, the number of parity symbols (and syndromes) corresponds to the value of 'RS parity length' divided by 'RS interleaving factor' per parameter registers section 410.

The RS syndromes determined in step 718 are applied in step 720 to detect and correct any erroneous symbols that may be present in each 'RS Data Length' unit of RS symbols. The 'RS parity length' syndromes are used by an algorithmic procedure that calculates locations and values of errors if any of the syndromes have non-zero values. If all the syndromes are zero-valued, then the algebraic correction procedure is skipped because a zero value in all syndromes is an indication of correctness (no errors) in all the RS symbol inputs.

If the all zero criterion is not met, the correction process is applied before each stream of 'RS data length' is issued as an output of step 720. If the all zero criterion is met, the correction procedure is bypassed and the associated stream of 'RS data length' symbols is issued as an output of step 720.

Step 722 receives 'RS data length' units of RS symbols from step 722 and converts the corrected RS symbols to user data format by packing the RS symbol data into an output stream of user data symbols. It is noted that step 722 is a reversal of step 506 of FIG. 5. Here, 'RS data length' symbols are converted to 'user data length' user data symbols, where these parameters are specified per parameter registers section 410. If the forward conversion of step 506 of FIG. 5 required insertion of additional bits to the final RS symbol, then this step removes the same number of bits from the final RS symbol as that symbol is converted back to user data format. Different configurations may be applied in which both the RS symbol width and the user data symbol width may vary. Decoder 22 of FIG. 6 shows a configuration of an embodiment of a decoder 22 in which the RS symbol size is 10 bits (as indicated leaving RS decoder 650) and the user data symbol size is 8 bits (as indicated for the user data leaving RS to user data packer 670). Other configurations of a given embodiment or other embodiments may employ different sizes of both the RS symbols and of the user data symbols.

Figure 8:
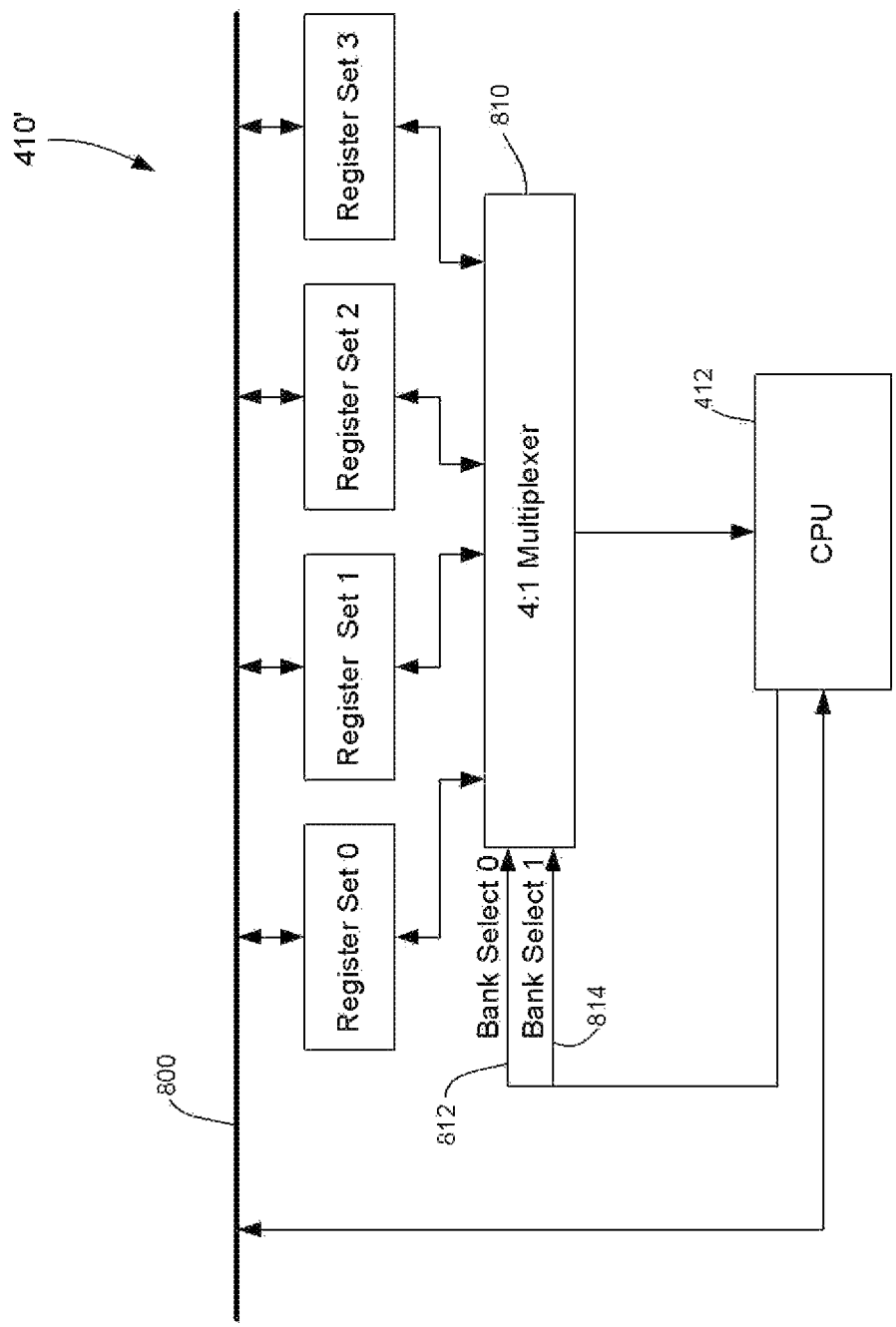
FIG. 8 is a block diagram which illustrates one embodiment of a parameter registers section that can form part of the system of FIG. 1 and which can be used by the encoding section of FIG. 4 as well as the decoding section of FIG. 6, shown here to illustrate details of a banked configuration having multiple register banks.

As noted above, parameters may be changeable on-the-fly in some embodiments for both encoding and decoding. To this end, one embodiment of the parameter register section is shown in FIG. 8 and generally indicated by the reference number 410'. This embodiment of the parameter registers section incorporates multiple register banks that are shown as register sets 0-3. The register sets are connected to a bus 800 which is, in turn, connected to CPU 412. Each register set is interfaced with a multiplexer 810. Mode select lines 0 and 1, indicated by reference numbers 812 and 814, respectively, provide for selecting any one of the register sets using multiplexer 810. Each register set is independently programmable by CPU 412. Each register set or bank is selectable by CPU 412 for purposes of selecting individual ones of the banks on-the-fly based on mode select lines 812 and 814. Thus, configuration changes may be accomplished with minimal latency (on-the-fly) by disabling an active bank and enabling another bank. As long as the necessary parameter registers have been loaded into register banks that are to be used, switches between the register banks can be achieved by changing the value specified by the mode select lines. It should be appreciated that any suitable number of register banks may be used for a particular embodiment and that the embodiment of FIG. 8 using four register banks is provided by way of example and is not intended as limiting.

By way of bus 800, CPU 412 can manage any necessary registers responsive to a change in the operational mode that is selected. The CPU can change the mode, for example, responsive to changing a parameter such as User Data length and the Convolutional Polynomials, among others and in response to the host device. It should be appreciated that changes in parameters can be reflected in this manner as quickly as on a codeword-to-codeword basis. In one embodiment, registers can be used to generate the bank selection signals and these registers can be written by the microprocessor any time it is determined that a change in banks is necessary. Mode changes can occur, for example, based on an arrangement of the memory cells such that one subset of the memory cells is intended to be written and read according to one set of parameters and a different subset of the memory cells is intended to be written and read according to another set of parameters. Memory cell subsets could be handled, in this regard, as partitions that are created by formatting a computer storage device.

With respect to encoder and decoder functions, a temporal consideration in accomplishing on-the-fly configuration changes in embodiments using banked architectures resides in the relationship between Bank Select 0 and Bank Select 1 state changes and data sequences. In one embodiment, the Bank Select changes would be allowed only during periods of no data sequencing activity. That is, the system is idle or can be made idle. This applies to both external signal activity and internal state activity of the affected function(s). As long as both of these are in an idle condition, a rapid change from one register configuration to another can be accomplished without impact to prior data sequencing, and the current register change may then apply the selected configuration to the next data sequence. The potential variety of changes is so sufficiently extensive as to encompass at least changes in User Data Length, RS Capacity, T (which also implies RS Parity Length), RS Interleaving Factor, Convolutional Polynomials, Puncture Polynomials, Bit Density settings, and TCM Codeword length, which is determined by a combination of the foregoing parameters, but can be explicitly programmed into the parameter registers section. It should be appreciated that any number of one or more parameters can be changed simultaneously, allowing for a degree of flexibility that provides sweeping advantages over the state-of-the-art. As described above, the code efficiency is affected in a direct way by changing parameter values and, thereby, as a result of switching between register sets.

Figure 9:
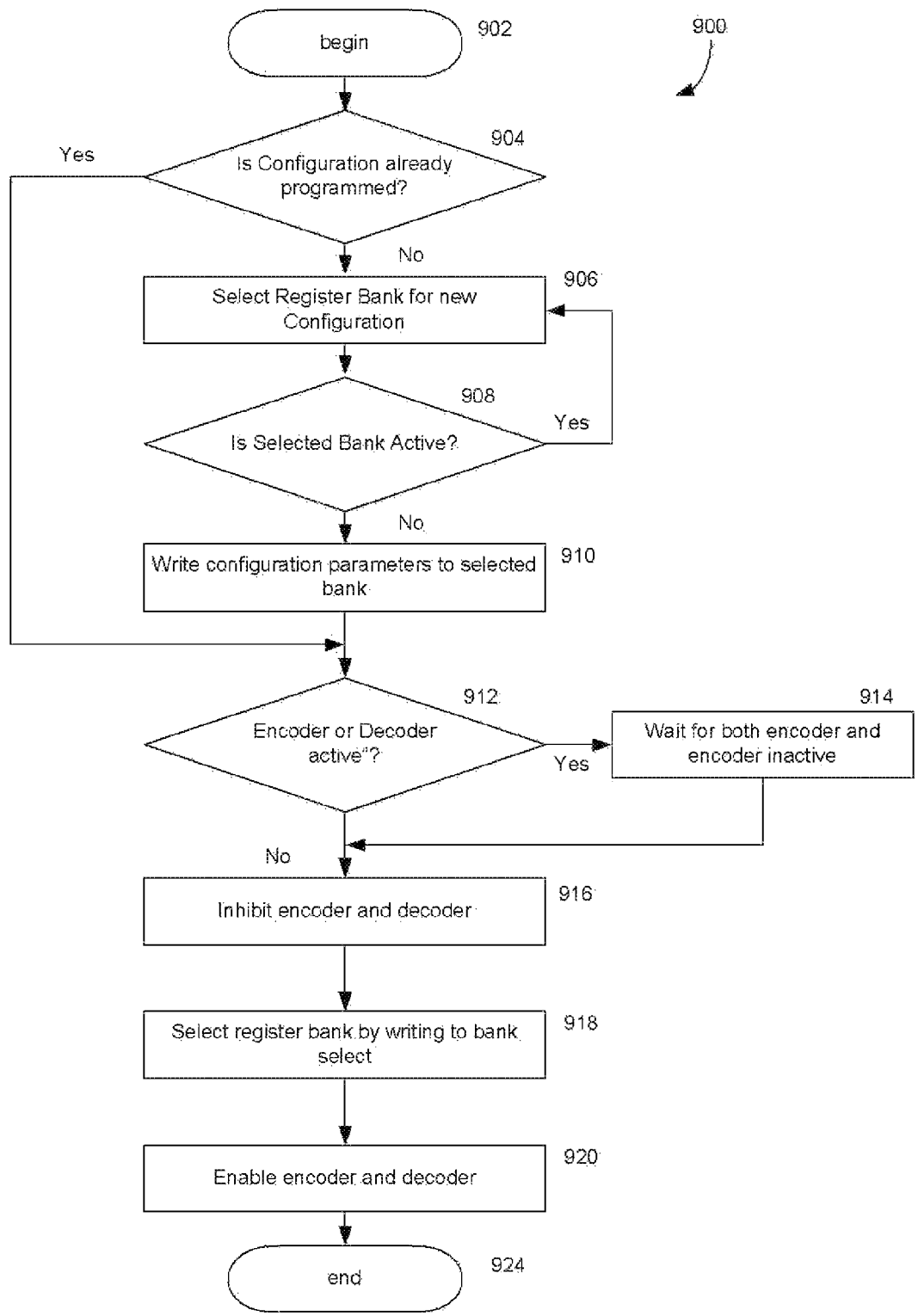
FIG. 9 is a flow diagram that illustrates one embodiment of a method for operation relating to the banked parameter section embodiment of FIG. 8.

Attention is now directed to FIG. 9 which is a flow diagram illustrating one embodiment of a method for operation of a system including the banked parameter register arrangement of FIG. 8, generally indicated by the reference number 900. In FIG. 9, parameters in the register banks are shared by both encoder and decoder. However, in other embodiments, the decoder and encoder and decoder can be separately supported by respective, dedicated register banks. The process begins at start step 902. For any particular configuration that is to be supported, at 904, CPU 412 (FIGS. 4 and 6) and firmware 480 establish whether a desired register configuration has already been programmed into one of the register banks. If it is determined that a new configuration is to be used, operation proceeds to step 906 in which a register bank is selected for the new configuration. This selection can be made in any appropriate manner that, first, may choose a register bank not previously programmed with a configuration; if no such unoccupied register bank is available, then a decision is made as to which register bank may be overwritten with the new configuration. After a register bank has been selected, at 908, it is ascertained whether the chosen register bank is the active bank. The "active" bank is the bank currently chosen to control the encoder and decoder. It should be appreciated that there can only be one "active" register bank. By definition, all register banks that are not active are inactive. One might expect that the choice of a register bank would be made only from among inactive register banks. But if the choice is made such that the selection is the active register bank, then the process returns to 906 to make another choice. If, on the other hand, the register bank selected by 906 is not active then operation advances to 910. At 910, the CPU programs or writes the various parameter registers into the selected bank, with each bank storing a set of each of the values for aforedescribed parameter registers section 410. Once the configuration has been written to the selected register bank, it is ready for use by the encoder or decoder. If the CPU determines that the newly programmed configuration is to be used during the next encoder or decoder sequence, then the CPU determines at 912 whether the encoder or decoder is currently engaged in a previous sequence. If the answer is yes, then the CPU must wait at 914 for the currently activity to complete. Returning briefly to step 904, in the event that an existing configuration is selected, operation proceeds to step 912.

Once both of the encoder and decoder are determined to be inactive, step 916 is entered from either step 914 or from a "No" decision by step 912. Step 916 may first inhibit the encoder and the decoder from engaging in a new data sequence. The method assures that no new sequences are initiated until the new or next register bank configuration is activated.

With reference to FIG. 9 in conjunction with FIG. 8, activation of the next configuration is accomplished at 918 when the CPU changes the value of bank selects, by using lines 812 and 814, in FIG. 8. If step 916 was applied so as to inhibit sequence initiation in either the encoder or decoder, then step 920 enables the encoder and decoder for new sequences. As soon as both encoder and decoder have been enabled, the process is complete at 920. A subsequent configuration change, as may be triggered by the CPU responsive to a request from the host to read from or write to cells designated by other configuration settings and will cause reentry at step 902.

It should be appreciated that once steps 904) through 914 have been accomplished, steps 916 through 920 accomplish configuration changes in only as much time as the CPU needs to execute an instruction to update bank selects 812 and 814 (FIG. 8). In other words, the configuration change is generally made very quickly with little or no effect on actual data sequencing to follow.

Turning again to FIG. 1, in view of the foregoing, it should be appreciated that nonvolatile memory 14 stores and retrieves data in units called codewords. Each codeword is the result the encoding process executed by encoder 20. When a codeword is retrieved from the nonvolatile memory 14, the decoding process executed by decoder 22 returns user data to host computer 12. A codeword is a collection of multilevel symbols of a particular length and a particular bit density setting, each of which may vary from codeword to codeword. Bit density setting determines the number of bits that are stored in each memory cell. In embodiments that store an integer number of bits per memory cell, the contents of one cell constitutes one TCM symbol from the codeword. The length of the codeword is the number of TCM symbols that make up the codeword. By way of example, three codewords are diagrammatically illustrated in FIG. 1 wherein a horizontal length represents the number of memory cells in each codeword, and a vertical width represents the number of bits in each memory cell which corresponds to the bit density. A first codeword 960, a second codeword 962 and a third codeword 964 are shown. It can be seen that Codeword 962 contains relatively fewer symbols than Codeword 960, but contains relatively greater bits per symbol. Codeword 964 can be seen to contain relatively fewer symbols than either Codeword 960 or Codeword 962, but contains relatively more bits per symbol than either Codeword 960 or Codeword 962. Hence, it is evident that codewords with varying TCM symbol width and varying length be concurrently stored in the nonvolatile memory. In this regard, memory 14 can represent a single integrated circuit die in which different regions of the die can store data with different code efficiencies, for example, at differing bit densities. In another embodiment, memory 14 can be divided among a plurality of integrated memory circuit dies.

Still referring to FIG. 1, a complete data structure, as written into memory 14, is diagrammatically shown and indicated by the reference number 970. It should be appreciated that this data structure was generated responsive to a single write operation containing given user data and is just as readily readable in a read operation to regenerate the given user data. Data structure 970, in the present example, is made up of five codewords that are indicated by the reference numbers 972, 974, 976, 978 and 980. Codewords 972, 974, 976 and 978 can each be of a different length. In the present example, codewords 972, 976 and 978 are of the same, second length, being made up of the same number of TCM symbols, while codeword 974 is of a different, second length. Terminating codeword 980 is shorter than the other codewords of data structure 970 of yet a third length. In this regard, it should be appreciated that it is not necessary in view of the teachings herein that every codeword in a transfer be of the same length, for example, by filling in empty space in the last codeword up to some required codeword length, since the final or terminating codeword can be ended through a termination or zero-stuffing sequence as described above. Further, as is demonstrated by data structure 970, successive codewords in the data structure, even residing in adjacent sets of memory cells in the memory, can store data at different code efficiencies including at different bit densities. For example, codeword 972 may store data at a bit density of 4 bits per memory cell, codeword 974 may store data at a bit density of 2 bits per memory cell, codeword 976 may store data at a bit density of 3 bits per memory cell, codeword 978 may store data at a bit density of 3 bits per memory cell and codeword 980 may store data at a bit density of bit per memory cell. Essentially no limitation is introduced with regard to the flexibility that is provided in changing code efficiency from codeword to codeword.

Attention is now directed to additional details with respect to fractional bit coding. In general, fractional bit coding can readily be implemented by taking a group of B input bits and mapping those combinations of bits into different level values for a number of cells (C), each having L possible level values. The requirement for the mapping is given as:

$$L^C \geq 2^B \quad (1)$$

For example, mapping 7 input bits into two cells, each set to one of 12 possible levels, will yield 7÷2=3.5 bits per cell.

These teachings can be efficiently implemented within the framework that has been provided herein. It is noted that a mapping function cannot be applied by mapper 450 of FIG. 4 in conjunction with the application of a fractional bit density. If the desired number of levels L is an even number, then the LSB can be handled without modification, for example, in the cases of 3 or 4 bits per cell, with the puncturing and placeholders unchanged such that the fractional coding is handled with just the MSBs. In the 3.5 bits per cell example, 5 MSB bits are mapped into two cells of 12÷2=6 possible levels. It should be appreciated that the optional step, described above, of treating incoming MSB values as Gray coded should not be applied in conjunction with fractional encoding.

During packing, wherein the unmapped TCM symbols are generated, the packing arrangement will vary between 2 MSB bits per TCM symbol (3 bits per cell mode) and 3 MSB bits (4 bits per cell mode). By doing so, in the correct proportion over C cells, the desired fractional bit density will be attained on average. Again, with this example, the coding block C is 2 cells, so the packer alternates between 3 MSB bits per TCM symbol and 2 MSB bits per TCM symbol. For the two cells, there are 3+2 MSB bits+2 LSB bits=7 user bits, yielding 3.5 bits per cell.

In terms of MSB mapping, groups of B unmapped TCM symbol MSBs are taken collectively and mapped as a group into C sets of L÷2 levels. In the present example, 3+2 MSB bits are mapped into 2 cells, each of 6 possible level values. For the five MSB bits the $2^5$=32 input values can be represented by the $6^2$=36 possible codings of the two memory cells based on a mapping from binary values to C cell values. For this embodiment, there will be four unused combinations of the cell level values which can be mapped to the nearest valid binary input value. The four unused combinations of the cell level values are the difference between the $6^2$=36 available levels versus the $2^5$=32 levels actually used. In view of the foregoing, one of ordinary skill in the art may readily implement a wide variety of fractional bit arrangements.

Figure 10:
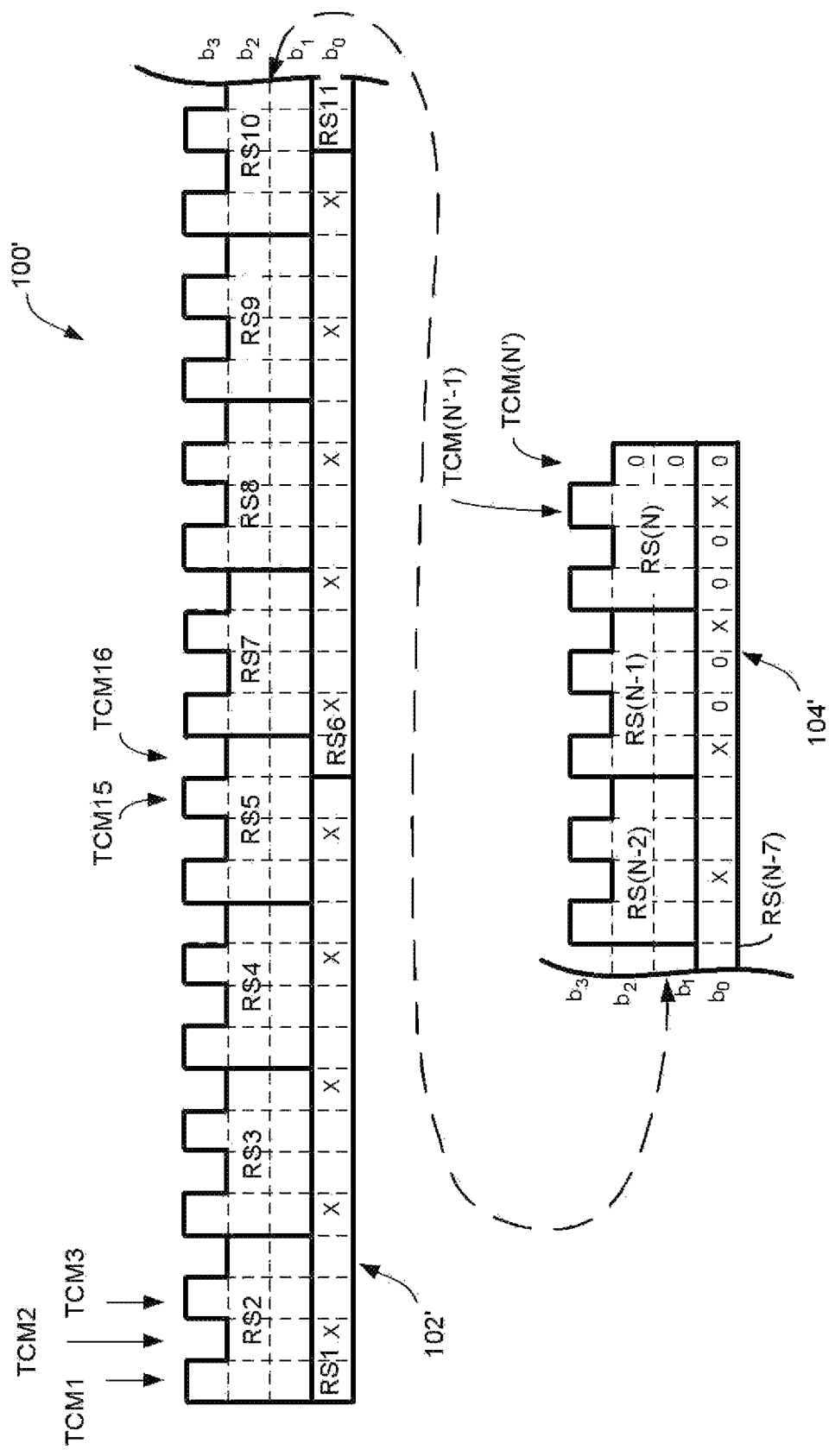
FIG. 10 is a diagrammatic illustration of another embodiment of a data structure that can be stored in the memory section of FIG. 1, shown here to illustrate further details with respect to fractional bit density.

Turning to FIG. 10 another embodiment of a data structure is diagrammatically illustrated, generally indicated by the reference number 100', which can be stored in nonvolatile memory 14 of FIG. 1. Data structure 100' includes an initial portion 102' and a terminating portion 104'. It should be appreciated that data structure 100' exemplifies the discussions immediately above. For example, the MSBs, from one TCM symbol to the next, alternate between three MSBs and two MSBs. Further, comparison of data structure 100' with data structure 100 of FIG. 2 reveals that data structure 100' is generally identical to data structure 100, except that data structure 100' implements a fractional bit density of 3.5 bits per cell. Accordingly, in view of the teachings that have been brought to light by the present disclosure, one of ordinary skill in the art may readily implement a wide variety of systems and methods that utilize fractional bit encoding.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

What is claimed is:

1. In a digital system configured with a nonvolatile memory for storing digital data, an apparatus comprising:
  a Reed Solomon encoder for receiving an input data stream including input data that is provided through the digital system to produce a Reed Solomon encoded stream that is made up of a series of Reed Solomon symbols;
  a packing arrangement that receives said Reed Solomon encoded stream for producing a re-blocked output data stream such that at least one portion but not all of the re-blocked output data stream is configured to be subject to a code efficiency based on a convolutional code and said packing arrangement is adapted to modify the re-blocked output data stream to support changes in the code efficiency of the convolutional code which is associated with a predetermined number of Reed Solomon symbols in the input stream based on changing one or more values of one or more input parameters that are provided to the packing arrangement; and
  a mapping arrangement for receiving the re-blocked output data stream and applying a TCM (Trellis Coded Modulation) code to the portion of the re-blocked output data stream, as the convolutional code, to produce a TCM encoded output data stream, said mapping arrangement including a convolutional encoder for convolutionally encoding said portion of the re-blocked output stream according to the code efficiency of said convolutional code to support said changes in the code efficiency as based on the values of the input parameters to produce a mapped output data stream for direction to the nonvolatile memory for storage therein as stored data.

2. The apparatus of claim 1 wherein said packing arrangement is configured for inserting one or more placeholder bits into the portion of the re-blocked output data stream based at least in part on the code efficiency and the convolutional encoder fills the placeholder bits with extra code bits in the mapped output data stream.

3. The apparatus of claim 2 wherein said packing arrangement and said mapping arrangement cooperate to convolutionally encode the portion of the re-blocked output data stream as a least significant bit of each one of a plurality of TCM symbols that make up the TCM encoded output data stream.

4. The apparatus of claim 3 wherein each TCM symbol is made up of a plurality of bits and said packing arrangement and said mapping arrangement cooperate to convolutionally encode the portion of the re-blocked output data stream as at least a least significant bit but less than all of the bits of each one of a plurality of TCM symbols that make up the TCM encoded output data stream such that the least significant bit and any additional bits that form part of said portion are in an ascending order of significance from the least significant bit.

5. The apparatus of claim 2 wherein said apparatus includes a puncture pattern counter for monitoring a puncture pattern that is based on at least one of said input parameters for producing said placeholder bits.

6. The apparatus of claim 2 wherein said Reed Solomon encoded stream is subject to a Reed Solomon block size such that one or more blocks of the Reed Solomon code make up a codeword having a codeword length and wherein said packing arrangement is configured to provide a customized number of the placeholder bits in the re-blocked output data stream according to a puncture pattern based on the code efficiency and said packing arrangement is reconfigurable based on said one or more input parameters at least for changing the puncture pattern from a current codeword to a next codeword during operation of the packing arrangement for changing the code efficiency.

7. The apparatus of claim 2 wherein the TCM encoded output data stream includes a plurality of TCM symbols and the least significant bits of the plurality of TCM symbols make up a first subset of Reed Solomon symbols taken from the series of Reed Solomon symbols and a second subset of Reed Solomon symbols taken from the series of Reed Solomon symbols includes all but the first subset of Reed Solomon symbols.

8. The apparatus of claim 7 wherein the Reed Solomon symbols of the first subset are each separated from one another in the series of Reed Solomon symbols by a number of one or more of the Reed Solomon symbols of the second subset based at least in part on the code efficiency such that the number of Reed Solomon symbols of the second subset which separates the Reed Solomon symbols of the first subset in said series can change responsive to a change in the code efficiency.

9. The apparatus of claim 7 wherein each TCM symbol is made up of a plurality of bits and said packing arrangement and said mapping arrangement are configured to cooperate to convolutionally encode the portion of the re-blocked output data stream as at least a least significant bit of each one of a plurality of TCM symbols but less than all of the bits that make up the TCM encoded output stream and said mapping arrangement includes a mapper section for applying a Gray code to binary code conversion to the second subset of remaining bits of each one of the plurality of TCM symbols other than the least significant bits which are convolutionally encoded.

10. The apparatus of claim 1 wherein said Reed Solomon encoded stream is subject to a block size such that one or more blocks of the Reed Solomon code make up a codeword having a codeword length and wherein said mapping arrangement includes a convolutional encoder that utilizes at least a set of two convolutional polynomials as part of generating said convolutional encoding and wherein the mapping arrangement is further configured such that said convolutional polynomials change responsive to said input parameters for changing at least one of (i) a total number of convolutional polynomials that make up the set and (ii) at least one of the convolutional polynomials in the set.

11. The apparatus of claim 1 wherein said nonvolatile memory is made up of a plurality of memory cells contained by at least one memory die and wherein said Reed Solomon encoded stream is subject to a block size such that one or more blocks of the Reed Solomon code make up a codeword having a codeword length and wherein said packing arrangement is configured to cooperate with the mapping arrangement to subject the Reed Solomon encoded stream to a specified bit density for at least some of the memory cells and said packing arrangement is reconfigurable based on one or more input parameters at least for changing the specified bit density from a current codeword to a next codeword during operation of the packing arrangement.

12. The apparatus of claim 11 wherein the packing arrangement is configured to cooperate with the mapping arrangement to store at least one codeword of data in a single memory die at a first bit density and at least a second codeword of data in said single memory die at a second bit density that is different from the first bit density.

13. The apparatus of claim 12 wherein said first bit density is selected as being from one bit to three bits per cell and said second bit density is selected as four bits per cell.

14. The apparatus of claim 11 wherein said selected bit density is determined based on at least one of a required lifetime of the nonvolatile memory and an output error rate that is associated with a read operation that accesses the nonvolatile memory.

15. The apparatus of claim 1, further comprising:
a demapping arrangement for receiving a memory output stream based on reading the stored data from the nonvolatile memory and for convolutionally decoding the memory output stream according to the code efficiency to reproduce said TCM encoded output data stream as a demapped output stream based on corresponding ones of the values of the input parameters as provided to the mapping arrangement;
an unpacking arrangement for receiving the demapped output stream and reproducing therefrom said Reed Solomon encoded stream based on said code efficiency, and said unpacking arrangement is responsive to changing the code efficiency of the convolutional code associated with said predetermined number of Reed Solomon symbols based on corresponding ones of the values of said one or more input parameters as provided to the packing arrangement; and
a Reed Solomon decoder for receiving the Reed Solomon encoded stream from the unpacking arrangement to decode therefrom a read data stream that includes said input data for use by the digital system as read data.

16. The apparatus of claim 15 wherein the read data corresponds to user data originally contained as said input data in the input data stream.

17. The apparatus of claim 1 wherein said packing arrangement and said mapping arrangement are configured to cooperate to produce said mapped output data stream such that, upon storage in the nonvolatile memory a fractional number of bits per cell is stored in a selected group of consecutive memory cells.

18. In a digital system configured with nonvolatile memory for storing digital data, a method comprising:
receiving an input data stream including input data that is provided through the digital system to produce a Reed Solomon encoded stream that is made up of a series of Reed Solomon symbols;
producing a re-blocked output data stream from said Reed Solomon encoded stream such that at least one portion of the re-blocked output data stream is configured to be subject to a code efficiency based on a convolutional code;

changing the code efficiency of the convolutional code which is associated with a predetermined number of Reed Solomon symbols in the input stream based on one or more input parameters; and convolutionally encoding said portion of the re-blocked output data stream according to the code efficiency and based on the input parameters to produce a mapped output data stream for direction to the nonvolatile memory for storage therein as stored data.

19. In a digital system configured with nonvolatile memory for storing digital data, an apparatus comprising:

a block code encoder for receiving an input data stream including input data that is provided through the digital system to produce a block code encoded stream that is made up of a series of block code symbols;

a packing arrangement that receives said block code encoded stream for producing a re-blocked output data stream such that at least one portion but not all of the re-blocked output data stream is configured to be subject to a code efficiency based on a convolutional code and said packing arrangement is adapted to modify the re-blocked output data stream to support changes in the code efficiency of the convolutional code which is associated with a predetermined number of block code symbols in the input stream based on changing one or more values of one or more input parameters that are provided to the packing arrangement; and a mapping arrangement for receiving the re-blocked output data stream from the packing arrangement and applying a TCM (Trellis Coded Modulation) code, as the convolutional code, to produce a TCM encoded output data stream, said mapping arrangement including a convolutional encoder for convolutionally encoding said portion of the re-blocked output stream according to the code efficiency of said convolutional code to support said changes in the code efficiency as based on the values of the input parameters to produce a mapped output data stream for direction to the nonvolatile memory for storage therein as stored data.

20. In a digital system configured with nonvolatile memory for storing digital data, a method comprising:

receiving an input data stream including input data that is provided through the digital system to produce a block code encoded stream that is made up of a series of block code symbols;

producing a re-blocked output data stream from said block code encoded stream such that at least one portion of the re-blocked output data stream is configured to be subject to a code efficiency based on a convolutional code;

changing the code efficiency of the convolutional code which is associated with a predetermined number of block code symbols in the input stream based on one or more input parameters; and convolutionally encoding said portion of the re-blocked output data stream according to the code efficiency and based on the input parameters to produce a mapped output data stream for direction to the nonvolatile memory for storage therein as stored data.

21. In a digital system configured with nonvolatile memory for storing digital data, an apparatus comprising:

a packing arrangement that is configured to receive a Reed Solomon encoded stream for producing a re-blocked output data stream such that at least one portion of the re-blocked output data stream is configured to be subject to a code efficiency based on a convolutional code and said packing arrangement is adapted for changes in the code efficiency of the convolutional code which is associated with a predetermined number of Reed Solomon symbols in the Reed Solomon encoded stream based on given values of one or more input parameters that are provided to the packing arrangement as an intermediate step preparatory to storing the re-blocked output data stream in the nonvolatile memory.

22. In a digital system configured with nonvolatile memory for storing digital data, a method comprising:

configuring a packing arrangement for receiving a Reed Solomon encoded stream for producing a re-blocked output data stream such that at least one portion of the re-blocked output data stream is configured to be subject to a code efficiency based on a convolutional code and adapting the packing arrangement for changes in the code efficiency of the convolutional code which is associated with a predetermined number of Reed Solomon symbols in the Reed Solomon encoded stream based on given values of one or more input parameters that are provided to the packing arrangement as an intermediate step preparatory to storing the re-blocked output data stream in the nonvolatile memory.

23. As part of a digital system configured with nonvolatile memory including a plurality of memory cells for storing digital data such that at least some of the memory cells can store more than one bit, an apparatus comprising:

a demapping arrangement for receiving a memory output stream based on reading the stored data from the nonvolatile memory where the memory output stream is in the form of a TCM (Trellis Coded Modulation) encoded output data stream having one portion but not all of the memory output stream being subject to a given code efficiency that is established by given values of a set of input parameters during an encoding operation and for convolutionally decoding the TCM encoded output data stream based on the given code efficiency to reproduce said TCM encoded output data stream as a demapped output stream based on the given values of the set of input parameters as provided during the encoding operation which demapped output stream contains a Reed Solomon encoded stream;

an unpacking arrangement for receiving the demapper output stream and reproducing therefrom said Reed Solomon encoded stream based on said given code efficiency and said unpacking arrangement is responsive to a different code efficiency based on by changing the set of input parameters; and a Reed Solomon decoder for receiving the Reed Solomon encoded stream from the unpacking arrangement to decode therefrom a read data stream that includes said input data for use by the digital system as read data.

24. In a digital system configured with nonvolatile memory including a plurality of memory cells for storing digital data such that at least some of the memory cells can store more than one bit, a method comprising:

configuring a demapping arrangement for receiving a memory output stream based on reading the stored data from the nonvolatile memory where the memory output stream is in the form of a TCM (Trellis Coded Modulation) memory output encoded output data stream having one portion but not all stream being subject to a given code efficiency that is established by given values of a set of input parameters during an encoding operation and for convolutionally decoding the TCM encoded output data stream based on the given code efficiency to reproduce said TCM encoded output data stream as a demapped output stream based on the given values of the set of input parameters as provided during the encoding operation which demapped output stream contains a Reed Solomon encoded stream;

receiving the demapper output stream, using an unpacking arrangement, and reproducing therefrom said Reed Solomon encoded stream based on said code efficiency such that the unpacking arrangement is responsive to a different code efficiency by changing the set of input parameters; and providing a Reed Solomon decoder for receiving the Reed Solomon encoded stream from the unpacking arrangement to decode therefrom a read data stream that includes said input data for use by the digital system as read data.

* * * * *